US012745433B2

(12) United States Patent
Yao et al.

(10) Patent No.: US 12,745,433 B2
(45) Date of Patent: Sep. 22, 2026

(54) SEMICONDUCTOR DEVICE

(71) Applicant: FUJI ELECTRIC CO., LTD., Kawasaki (JP)

(72) Inventors: Noriaki Yao, Matsumoto-city (JP); Yuji Kumagai, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 909 days.

(21) Appl. No.: 18/160,554

(22) Filed: Jan. 27, 2023

(65) Prior Publication Data

US 2023/0290816 A1 Sep. 14, 2023

(30) Foreign Application Priority Data

Mar. 9, 2022 (JP) ................................. 2022-036427

(51) Int. Cl.
*H01L 29/06* (2006.01)
*H10D 30/66* (2025.01)
(Continued)

(52) U.S. Cl.
CPC ......... *H10D 62/111* (2025.01); *H10D 30/665* (2025.01); *H10D 62/157* (2025.01)

(58) Field of Classification Search
CPC .. H10D 62/111; H10D 30/665; H10D 62/157; H10D 62/051;
(Continued)

(56) References Cited

U.S. PATENT DOCUMENTS

2016/0035881 A1 2/2016 Tamura et al.
2017/0054000 A1 2/2017 Tatemichi et al.
(Continued)

FOREIGN PATENT DOCUMENTS

JP 2017-041622 A 2/2017
JP 2017139362 A 8/2017
(Continued)

OTHER PUBLICATIONS

Masanori Inoue et al., "High Reliability Power MOSFETs for Space Applications", Fuji Electric Review, 2009, vol. 56, No. 2, pp. 69-73; with English translation.
(Continued)

*Primary Examiner* — Cuong B Nguyen
(74) *Attorney, Agent, or Firm* — Rabin & Berdo, P.C.

(57) ABSTRACT

A drift layer has a SJ structure with a parallel pn layer; an $n^+$-type buffer layer is between the parallel pn layer and an $n^{++}$-type drain layer. An impurity concentration of the $n^+$-type buffer layer is adjusted to be at least equal to that of n-type column regions of the parallel pn layer, to be relatively low in a portion facing the parallel pn layer and approach the impurity concentration of the n-type column regions, and to increase closer to the $n^{++}$-type drain layer. The impurity concentration of the $n^+$-type buffer layer is adjusted so that an impurity concentration difference between the $n^+$-type buffer layer and the $n^{++}$-type drain layer near the border between the $n^+$-type buffer layer and the $n^{++}$-type drain layer is as small as possible. An impurity concentration distribution of the $n^+$-type buffer layer is formed by stacking $n^+$-type buffer layers in descending order of impurity concentration from the $n^{++}$-type drain layer.

6 Claims, 31 Drawing Sheets

(51) Int. Cl.
*H10D 62/10* (2025.01)
*H10D 62/13* (2025.01)

(58) Field of Classification Search
CPC ........ H10D 30/0291–0297; H10D 30/66–669; H10D 30/64–669
See application file for complete search history.

(56) References Cited

U.S. PATENT DOCUMENTS

| | | | | |
|---|---|---|---|---|
| 2019/0148484 | A1* | 5/2019 | Kowalik-Seidl ..... | H10D 62/111 257/329 |
| 2019/0198659 | A1 | 6/2019 | Lichtenwalner et al. | |

FOREIGN PATENT DOCUMENTS

| | | | |
|---|---|---|---|
| WO | 2015/040938 | A1 | 3/2015 |
| WO | 2022020147 | A2 | 1/2022 |

OTHER PUBLICATIONS

Office Action issued for corresponding Japanese Patent Application No. 2022-036427 dated Dec. 2, 2025.

* cited by examiner

<EXAMPLE : GENERATED IMPACT ION AMOUNT>

<EXAMPLE : GENERATED IMPACT ION AMOUNT>

<EXAMPLE : GENERATED IMPACT ION AMOUNT>

<EXAMPLE : GENERATED IMPACT ION AMOUNT>

<EXAMPLE>

<FIRST CONVENTIONAL EXAMPLE : GENERATED IMPACT ION AMOUNT>

<FIRST CONVENTIONAL EXAMPLE : GENERATED IMPACT ION AMOUNT>

<FIRST CONVENTIONAL EXAMPLE : GENERATED IMPACT ION AMOUNT>

<FIRST CONVENTIONAL EXAMPLE : GENERATED IMPACT ION AMOUNT>

<FIRST CONVENTIONAL EXAMPLE>

<SECOND CONVENTIONAL EXAMPLE : GENERATED IMPACT ION AMOUNT>

<SECOND CONVENTIONAL EXAMPLE : GENERATED IMPACT ION AMOUNT>

<SECOND CONVENTIONAL EXAMPLE : GENERATED IMPACT ION AMOUNT>

<SECOND CONVENTIONAL EXAMPLE : GENERATED IMPACT ION AMOUNT>

<EXAMPLE : CURRENT DENSITY>

<EXAMPLE : CURRENT DENSITY>

<EXAMPLE : CURRENT DENSITY>

<EXAMPLE : CURRENT DENSITY>

<EXAMPLE : ELECTRIC FIELD STRENGTH>

<EXAMPLE : ELECTRIC FIELD STRENGTH>

<EXAMPLE : ELECTRIC FIELD STRENGTH>

<EXAMPLE : ELECTRIC FIELD STRENGTH>

<FIRST CONVENTIONAL EXAMPLE : CURRENT DENSITY>

<FIRST CONVENTIONAL EXAMPLE : CURRENT DENSITY>

<FIRST CONVENTIONAL EXAMPLE : CURRENT DENSITY>

<FIRST CONVENTIONAL EXAMPLE : CURRENT DENSITY>

<FIRST CONVENTIONAL EXAMPLE : ELECTRIC FIELD STRENGTH>

<FIRST CONVENTIONAL EXAMPLE : ELECTRIC FIELD STRENGTH>

<FIRST CONVENTIONAL EXAMPLE : ELECTRIC FIELD STRENGTH>

<FIRST CONVENTIONAL EXAMPLE : ELECTRIC FIELD STRENGTH>

<SECOND CONVENTIONAL EXAMPLE : CURRENT DENSITY>

<SECOND CONVENTIONAL EXAMPLE : CURRENT DENSITY>

<SECOND CONVENTIONAL EXAMPLE : CURRENT DENSITY>

<SECOND CONVENTIONAL EXAMPLE : CURRENT DENSITY>

<SECOND CONVENTIONAL EXAMPLE : ELECTRIC FIELD STRENGTH>

<SECOND CONVENTIONAL EXAMPLE : ELECTRIC FIELD STRENGTH>

<SECOND CONVENTIONAL EXAMPLE : ELECTRIC FIELD STRENGTH>

<SECOND CONVENTIONAL EXAMPLE : ELECTRIC FIELD STRENGTH>

SEMICONDUCTOR DEVICE

CROSS REFERENCE TO RELATED APPLICATIONS

This application is based upon and claims the benefit of priority of the prior Japanese Patent Application No. 2022-036427, filed on Mar. 9, 2022, the entire contents of which are incorporated herein by reference.

BACKGROUND OF THE INVENTION

1. Field of the Invention

Embodiments of the invention relate to a semiconductor device.

2. Description of the Related Art

Semiconductor devices such as insulated gate bipolar transistors (IGBTs), metal oxide semiconductor field effect transistors (MOSFETs) that have insulated gates formed by a 3-layer structure including a metal, an oxide film, and a semiconductor, etc. are widely used for power converting equipment.

Further, a MOSFET is commonly known that has a super junction (SJ) structure (hereinafter, SJ-MOSFET) in which a drift layer is a parallel pn layer in which n-type regions and p-type regions are disposed to be adjacent to one another so as to repeatedly alternate with one another in a direction parallel to a main surface of a semiconductor substrate. The drift layer is implemented as a parallel pn layer, whereby the impurity concentration of the drift layer may be increased, and the on-resistance may be significantly reduced as compared to a normal drift layer configured by only $n^-$-type regions.

The on-resistance of the SJ-MOSFET is low as described above, thereby, enabling size reductions and faster speeds for a semiconductor circuit device that uses the MOSFET as a component; such SJ-MOSFETs are used for various types of applications. The SJ-MOSFET is a vertical semiconductor device that has a source electrode and a drain electrode, respectively, on the front surface and the back surface of the semiconductor substrate, and between the electrodes, a main current flows in the semiconductor substrate in vertical direction that is orthogonal to the main surfaces of the semiconductor substrate.

A structure of a conventional SJ-MOSFET is described. FIG. 23 is a cross-sectional view depicting the structure of a conventional semiconductor device. FIGS. 24, 25, and 26 are cross-sectional views depicting states of the conventional semiconductor device during manufacture. FIG. 27 is a cross-sectional view depicting another example of a state of the conventional semiconductor device during manufacture. The conventional semiconductor device 110 depicted in FIG. 23 is a SJ-MOSFET with a planar gate structure that has, in a semiconductor substrate (semiconductor chip) 120 that contains silicon (Si) as a semiconductor material, a parallel pn layer 103 that constitutes a drift layer.

In the semiconductor substrate 120, semiconductor layers 122, 123 are sequentially stacked on an $n^{++}$-type starting substrate 121 that contains silicon as a semiconductor material; the semiconductor layers 122, 123 constitute an n-type buffer layer 102 and the drift layer (the parallel pn layer 103), respectively. The $n^{++}$-type starting substrate 121 constitutes an $n^{++}$-type drain layer 101. The semiconductor layers 122, 123 that constitute the n-type buffer layer 102 and the parallel pn layer 103 are formed using an epitaxial growth method.

The parallel pn layer 103 is formed by disposing n-type regions (hereinafter, n-type column regions) 131 and p-type regions (hereinafter, p-type column regions) 132 to be adjacent and repeatedly alternate with one another in a direction parallel to a main surface of the semiconductor substrate 120. To sustain a predetermined breakdown voltage, charge balance between the n-type column regions 131 and the p-type column regions 132 adjacent to one another has to be maintained and when the charge balance is lost, the breakdown voltage drops drastically.

Close to a border between the parallel pn layer 103 and the n-type buffer layer 102, an impurity concentration of the n-type buffer layer 102 contributes greatly to the charge balance between the n-type column regions 131 and the p-type column regions 132 that are adjacent to one another in the parallel pn layer 103. Therefore, the impurity concentration of the n-type buffer layer 102 has to be set with care so as to not adversely affect the charge balance between the n-type column regions 131 and the p-type column regions 132.

For example, typically, the impurity concentration of the n-type buffer layer 102 is the same as an impurity concentration of the n-type column regions 131 or is lower than the impurity concentration of the n-type column regions 131. The charge balance is an index that indicates a degree of equilibrium of a charge amount expressed as a product of a carrier concentration (concentration of activated impurity) of the n-type column regions 131 and a width w101 thereof and a charge amount expressed as a product of a carrier concentration of the p-type column regions 132 and a width w102 thereof.

Further, in the SJ-MOSFET, during reverse recovery operation when main junctions (pn junctions) are reverse biased, a depletion layer spreads from pn junctions between the p-type column regions 132 and the n-type column regions 131. Typically, specifications and conditions of the parallel pn layer 103 are determined so that when voltage that is positive with respect to a source electrode 111 and about equal to a rated voltage is applied to a drain electrode 112, the depletion layer spreads in the entire parallel pn layer 103 so as to reach inside the n-type buffer layer 102.

The parallel pn layer 103, for example, is formed using a multistage epitaxial method. The multistage epitaxial method is a method of dividing epitaxial growth of the n-type semiconductor layer 123 constituting the drift layer into multiple stages (multiple sessions) and p-type regions are selectively formed in each stage so as to be adjacent to one another in a depth direction by ion-implanting a p-type impurity in each epitaxially grown layer of the semiconductor layer 123; the p-type regions form the p-type column regions 132.

In particular, in an instance in which the parallel pn layer 103 is formed using the multistage epitaxial method, first, as depicted in FIG. 24, the n-type semiconductor layer 122, which constitutes the n-type buffer layer 102, is epitaxially grown on the $n^{++}$-type starting substrate 121, which constitutes the $n^{++}$-type drain layer 101. The $n^{++}$-type drain layer 101 (i.e., the $n^{++}$-type starting substrate 121) has an impurity concentration and a thickness that are, for example, about $4.0\times10^{19}/cm^3$ and about 60 μm, respectively.

The n-type buffer layer 102 is formed by one stage (one session) of epitaxial growth to have a predetermined thickness t102 (for example, about 20 μm, refer to FIG. 23). The impurity concentration of the n-type buffer layer 102 is about $2.0\times10^{16}/cm^3$ and uniform. Therefore, in a direction from a front surface of the semiconductor substrate 120 to a back surface thereof, an n-type impurity concentration distribution is uniform without an impurity concentration gradient in the n-type buffer layer 102 and becomes extremely high at the interface between the n-type buffer layer 102 and the $n^{++}$-type drain layer 101.

Next, as depicted in FIG. 25, the n-type semiconductor layer 123 (123-1) constituting the drift layer is epitaxially grown on the n-type buffer layer 102 to have a thickness Δt103 that is thinner than a final thickness t103 (for example, 40 μm, refer to FIG. 23) of the parallel pn layer 103. Next, by photolithography and ion implantation of a p-type impurity, p-type implanted regions 132*a*-1 are selectively formed in the semiconductor layer 123-1, at positions where the p-type column regions 132 are to be formed.

Next, as depicted in FIG. 26, an n-type semiconductor layer 123-2 is epitaxially grown on the semiconductor layer 123-1 to have the predetermined thickness Δt103, whereby the thickness of the semiconductor layer 123 is increased. Next, by photolithography and ion implantation of a p-type impurity, in the portion (the semiconductor layer 123-2) by which the thickness of the semiconductor layer 123 is increased, p-type implanted regions 132*a*-2 are selectively formed at positions where the p-type column regions 132 are to be formed.

In this manner, for each stage of epitaxial growth performed until the semiconductor layer 123 reaches the final thickness t103 (here, 10 stages), p-type implanted regions 132*a* are selectively formed in each of the grown semiconductor layers 123-1 to 123-10, at positions where the p-type column regions 132 are to be formed. The semiconductor layers 123-1 to 123-10 of the multiple stages, for example, are formed to each have the thickness Δt103 that is obtained by equally dividing the final thickness t103 of the parallel pn layer 103 by the number of stages.

P-type base regions 104 formed in the semiconductor layer 123-10 of the uppermost stage and the p-type regions 132-9 formed in the semiconductor layer 123-9, which is beneath the semiconductor layer 123-10, suffice to be in contact with one another and the p-type implanted regions 132*a* that constitute the p-type column regions 132 in the semiconductor layer 123-10 of the uppermost stage may be omitted. Here, an instance is depicted in which in each of the semiconductor layers 123-1 to 123-9, the p-type implanted regions (here, only the p-type implanted regions 132*a*-1, 132*a*-2 formed in the semiconductor layers 123-1, 123-2, respectively are depicted) are formed at positions where the p-type column regions 132 are to be formed.

A heat treatment is performed, whereby the p-type implanted regions formed in each of the semiconductor layers 123-1 to 123-9 become the p-type regions 132-1 to 132-9, which have a substantially circular shape in a cross-sectional view as a result of the p-type impurity being scattered in a radiating pattern centered around a depth position of the range of each ion implantation. The p-type regions 132-1 to 132-9 that are adjacent to one another in the depth direction are connected with one another, thereby forming the p-type column regions 132. In the semiconductor layer 123, portions thereof between adjacent p-type column regions 132 are free of ion implantation and remain as an n-type to constitute the n-type column regions 131.

Further, as depicted in FIG. 27, for each stage of the epitaxial growth of the n-type semiconductor layer 123, an n-type impurity may be ion-implanted in each of the grown semiconductor layers 123-1 to 123-10, whereby n-type implanted regions (here, only n-type implanted regions 131*a*-1, 131*a*-2 formed in each of the semiconductor layers 123-1, 123-2 are depicted) may be formed at positions where the n-type column regions 131 are to be formed. Provided n-type regions are between adjacent p-type base regions 104, the n-type implanted regions that are to constitute the n-type column regions 131 need not be formed in the semiconductor layer 123-10 of the uppermost stage.

A heat treatment is performed, whereby the n-type implanted regions formed in each of the semiconductor layers 123-1 to 123-10 become the n-type regions 131-1 to 131-10, which have a substantially circular shape in a cross-sectional view as a result of the n-type impurity being scattered in a radiating pattern centered around a depth position of the range of each ion implantation. In this manner, the multistage epitaxial method is used, whereby the parallel pn layer 103 having the predetermined thickness t103 and configured by the n-type column regions 131 and the p-type column regions 132 is formed.

In FIGS. 24 to 27, the $n^{++}$-type starting substrate 121 is simplified and the thickness t101 of the $n^{++}$-type starting substrate 121 is depicted thinner than in FIG. 23. Reference numerals 104, 105, 106, 107, and 108 are, respectively, p-type base regions, $n^+$-type source regions, $p^{++}$-type contact regions, a gate insulating film, and gate electrodes that configure the planar gate structure, and are provided between the front surface of the semiconductor substrate 120 and the parallel pn layer 103. Reference numeral 109 is an interlayer insulating film.

As for a conventional SJ-MOSFET, a device has been proposed that has an n-type buffer layer formed by one stage or two stages of epitaxial growth, the n-type buffer layer being between an $n^{++}$-type starting substrate that constitutes an $n^{++}$-type drain layer and a parallel pn layer that constitutes a drift layer (for example, refer to Japanese Laid-Open Patent Publication No. 2017-041622, International Publication No. WO 2015/040938, and Inoue, M., et al, "High Reliability Power MOSFETs for Space Applications", Fuji Electric Journal, Fuji Electric, 2009, Vol. 82, No. 6, p.393 (37)-397(41)). Japanese Laid-Open Patent Publication No. 2017-041622 discloses that the n-type buffer layer is formed by one stage of epitaxial growth and the impurity concentration of the n-type buffer layer may be higher than the impurity concentration of the n-type column regions of the parallel pn layer.

International Publication No. WO 2015/040938 discloses that the n-type buffer layer has two stages of differing impurity concentrations and is formed by two stages of epitaxial growth, the n-type buffer layer facing the parallel pn layer has a thickness of 9 μm and an impurity concentration that is $1.0\times10^{15}/cm^3$, which is lower than the impurity concentration of the n-type column regions of the parallel pn layer; the n-type buffer layer facing the $n^{++}$-type drain layer has an impurity concentration that is $1.0\times10^{16}/cm^3$, which is higher than the impurity concentration of the n-type column regions of the parallel pn layer and thickness of 15 μm so that during reverse recovery operation, the depletion layer does not spread completely; and the impurity concentration of the $n^{++}$-type drain layer is $2.0\times10^{18}/cm^3$.

In Inoue, M., et al, "High Reliability Power MOSFETs for Space Applications", an $n^-$-type buffer layer is provided that is formed by one stage of epitaxial growth, has a specific resistance (high impurity concentration) that is lower than that of an $n^-$-type drift region and a specific resistance (low impurity concentration) that is higher than that of an $n^{++}$-type drain layer, whereby increases in the on-resistance (total electrical resistance of $n^-$-type drift region and $n^-$-type buffer layer (=specific resistance×thickness)) are suppressed and tolerance is enhanced against the phenomenon of single event burnout (SEB), which is instant burnout of a semiconductor device due to a high electric field region formed by irradiation of high-energy charged particles.

SUMMARY OF THE INVENTION

According to an embodiment of the invention, a semiconductor device includes: a semiconductor substrate having a first main surface and a second main surface that are opposite to each other; a parallel pn layer in which a plurality of first-conductivity-type regions and a plurality of second-conductivity-type regions are disposed so as to be adjacent to one another and repeatedly alternate with one another, the parallel pn layer being provided in the semiconductor substrate; a device structure provided between the first main surface of the semiconductor substrate and the parallel pn layer; a first semiconductor layer of a first conductivity type, the first semiconductor layer being provided between the second main surface of the semiconductor substrate and the parallel pn layer and having an impurity concentration that is higher than an impurity concentration of the first-conductivity-type regions; a second semiconductor layer of the first conductivity type, the second semiconductor layer being provided between the first semiconductor layer and the parallel pn layer and having an impurity concentration that is lower than the impurity concentration of the first semiconductor layer; a first electrode provided on the first main surface, the first electrode being electrically connected to the device structure; and a second electrode provided on the second main surface, the second electrode being electrically connected to the first semiconductor layer. The impurity concentration of the second semiconductor layer is at least equal to the impurity concentration of the first-conductivity-type regions, the impurity concentration in the second semiconductor layer increasing with reduced distance from the first semiconductor layer.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is an enlarged view of a vicinity of a border between an active region and an edge termination region in FIG. 1.

FIG. 5 is a characteristics diagram depicting p-type impurity concentration distribution of the semiconductor substrate depicted in FIG. 3.

FIG. 6 is a cross-sectional view depicting a state of the semiconductor device according to the embodiment during manufacture.

DETAILED DESCRIPTION OF THE INVENTION

First, problems associated with the conventional techniques are discussed. Normally, in a SJ-MOSFET, design is such that when voltage that is positive with respect to the source electrode 111 is applied to the drain electrode 112 and increases to about the rated voltage, during reverse recovery operation, a depletion layer that spreads in a direction from the main junctions (pn junctions) to the back surface of the semiconductor substrate 120 stops in the n-type buffer layer 102. Nonetheless, during reverse recovery operation, when the semiconductor substrate 120 is irradiated with cosmic rays (stream of particles such as neutrons and heavy particles: cosmic radiation), electron hole pairs are generated along the cosmic ray irradiation path, and the field strength distribution in the semiconductor substrate 120 becomes out of balance.

Figure 23:
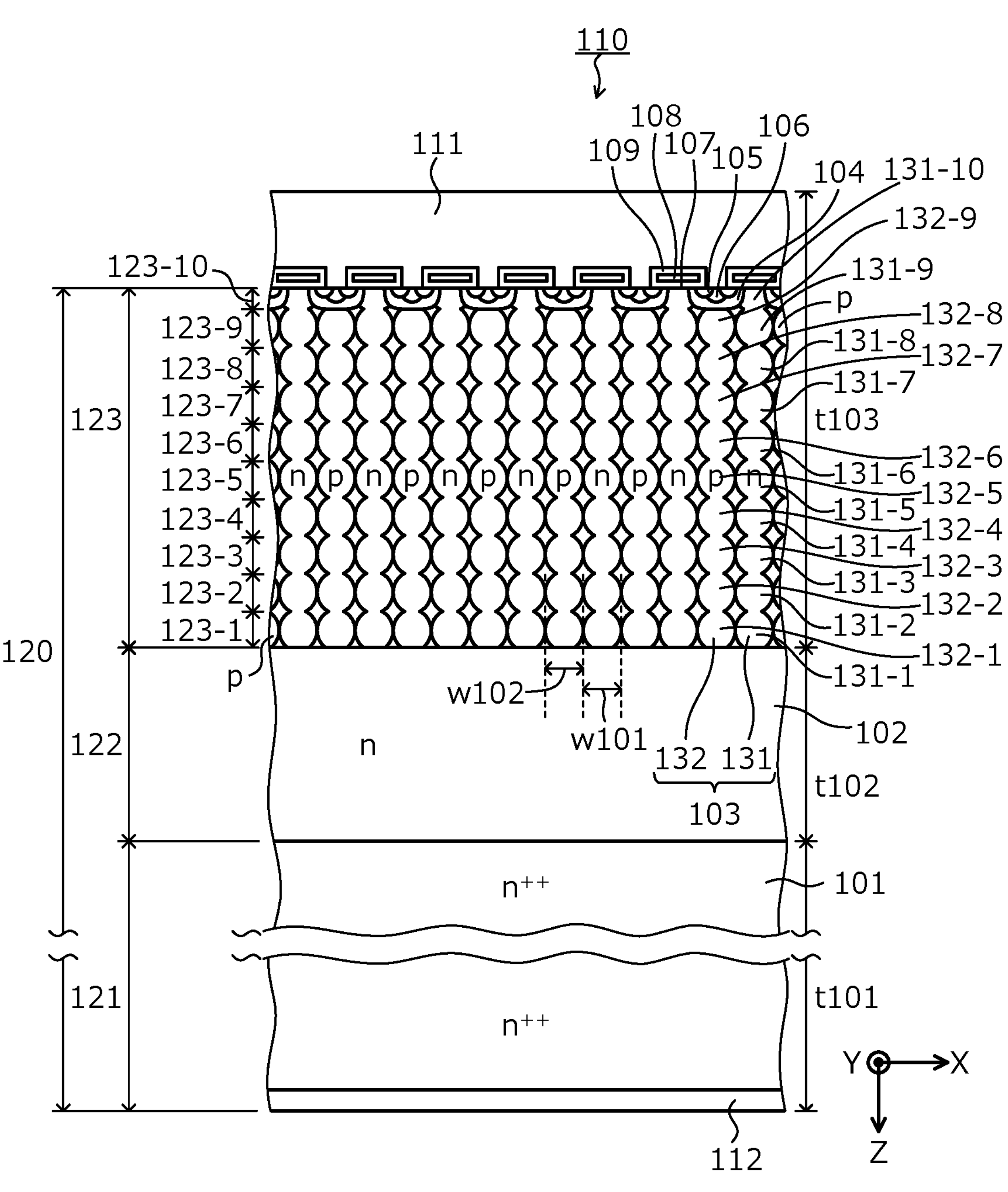
FIG. 23 is a cross-sectional view depicting a structure of a conventional semiconductor device.
Figure 24:
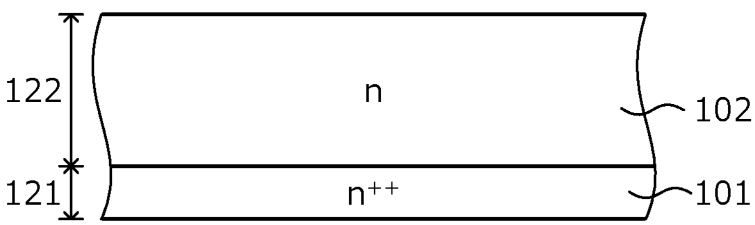
FIG. 24 is a cross-sectional view depicting a state of the conventional semiconductor device during manufacture.
Figure 25:
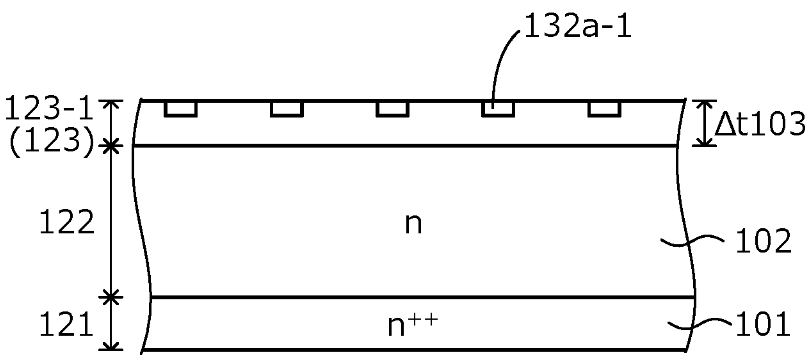
FIG. 25 is a cross-sectional view depicting a state of the conventional semiconductor device during manufacture.
Figure 26:
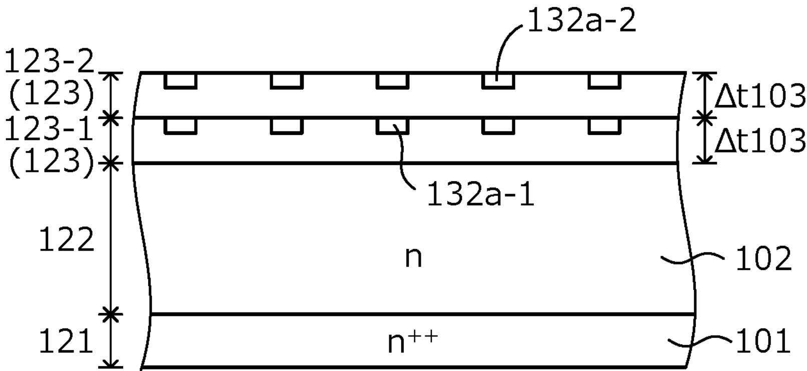
FIG. 26 is a cross-sectional view depicting a state of the conventional semiconductor device during manufacture.
Figure 27:
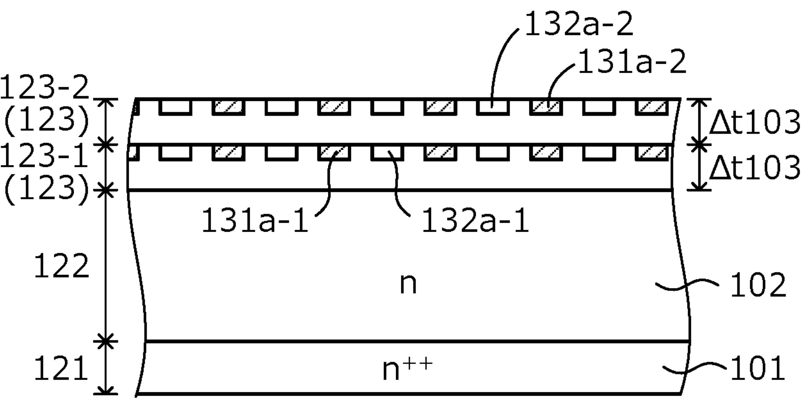
FIG. 27 is a cross-sectional view depicting another example of a state of the conventional semiconductor device during manufacture.

In the conventional semiconductor device 110 (refer to FIG. 23), during reverse recovery operation, when the depletion layer, which rapidly spreads due to the irradiation of cosmic rays, reaches the interface between the n-type buffer layer 102 and the $n^{++}$-type drain layer 101, the depletion layer is rapidly suppressed by an extremely large impurity concentration difference between the n-type buffer layer 102 and the $n^{++}$-type drain layer 101. As a result, electric field concentrates at the interface between the n-type buffer layer 102 and the $n^{++}$-type drain layer 101, avalanche breakdown occurs at locations where electric field concentrates, and there is a risk of destruction due to hole current that is amplified by the avalanche breakdown.

Further, to suppress electric field concentration at the interface between the n-type buffer layer 102 and the $n^{++}$-type drain layer 101, the thickness t102 of the n-type buffer layer 102 is designed to be thicker than a certain amount so that the depletion layer does not reach the interface between the n-type buffer layer 102 and the $n^{++}$-type drain layer 101. The greater is the thickness t102 of the n-type buffer layer 102, the longer is the current path of a main current that flows between the source electrode 111 and the drain electrode 112, in a direction orthogonal to a main surface of the semiconductor substrate 120 during the on-state of the semiconductor device 110 and thus, a problem arises in that conduction loss increases.

In the SJ-MOSFETs disclosed by Japanese Laid-Open Patent Publication No. 2017-041622 and Inoue, M., et al, "High Reliability Power MOSFETs for Space Applications", the n-type buffer layer in which the impurity concentration is uniform in the depth direction is formed by one stage of epitaxial growth and thus, the same problem as that of the conventional semiconductor device 110 occurs. In the SJ-MOSFET disclosed in International Publication No. WO 2015/040938, while the n-type buffer layer that has two stages of differing impurity concentrations is formed by two stages of epitaxial growth, the impurity concentration difference between the n-type buffer layer facing the $n^{++}$-type drain layer and that facing the $n^{++}$-type drain layer is large and thus, the same problem as that of the conventional semiconductor device 110 arises.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
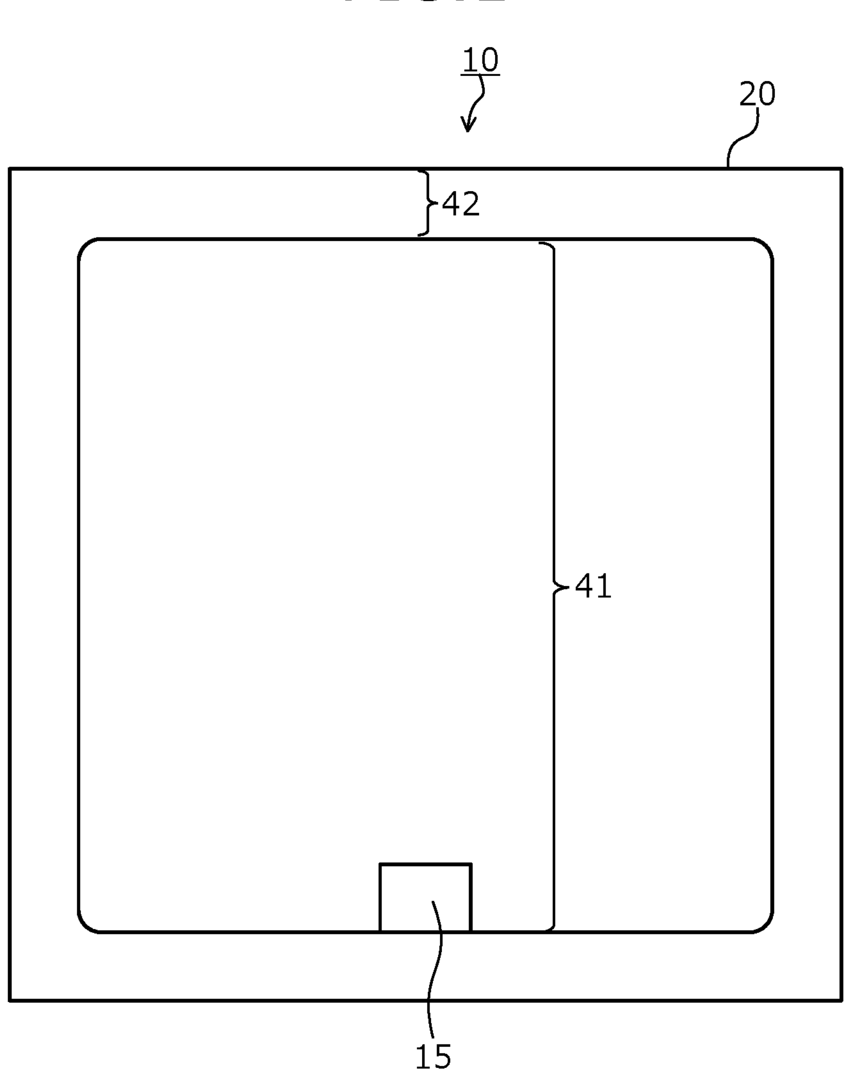
FIG. 1 is a plan view depicting a layout when a semiconductor device according to an embodiment is viewed from a front side of a semiconductor substrate thereof.
Figure 2:
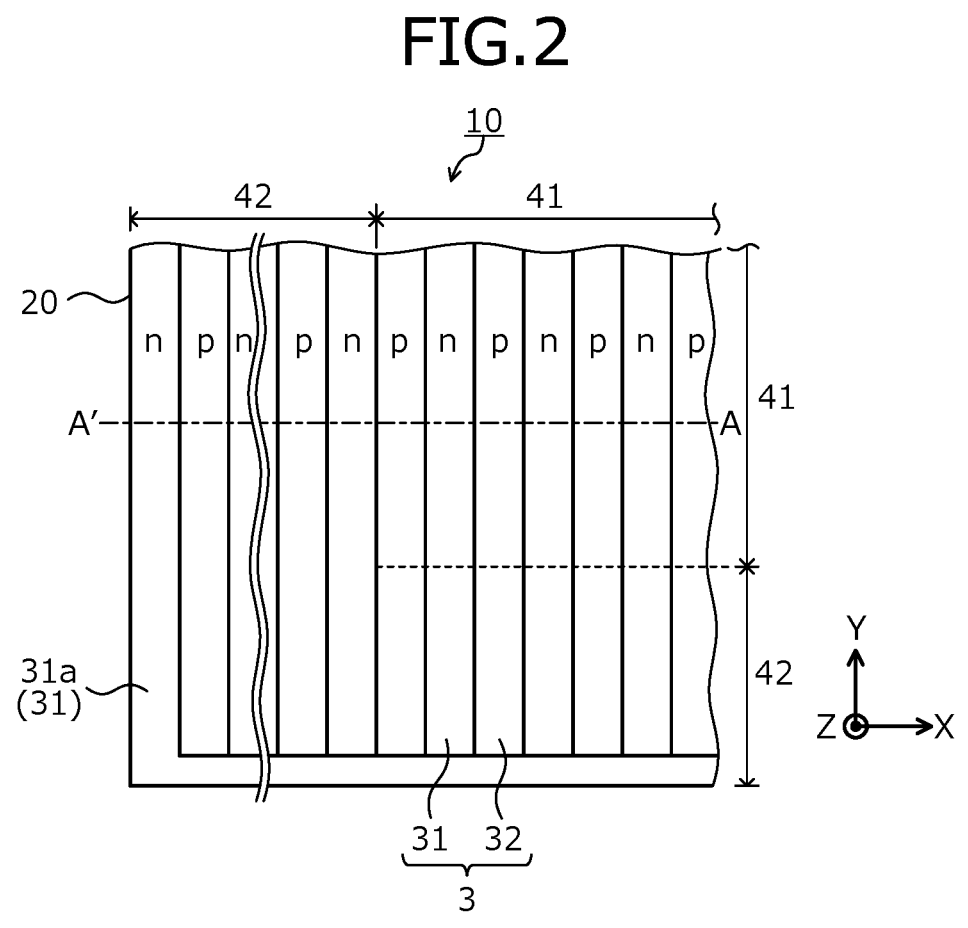
Figure 3:
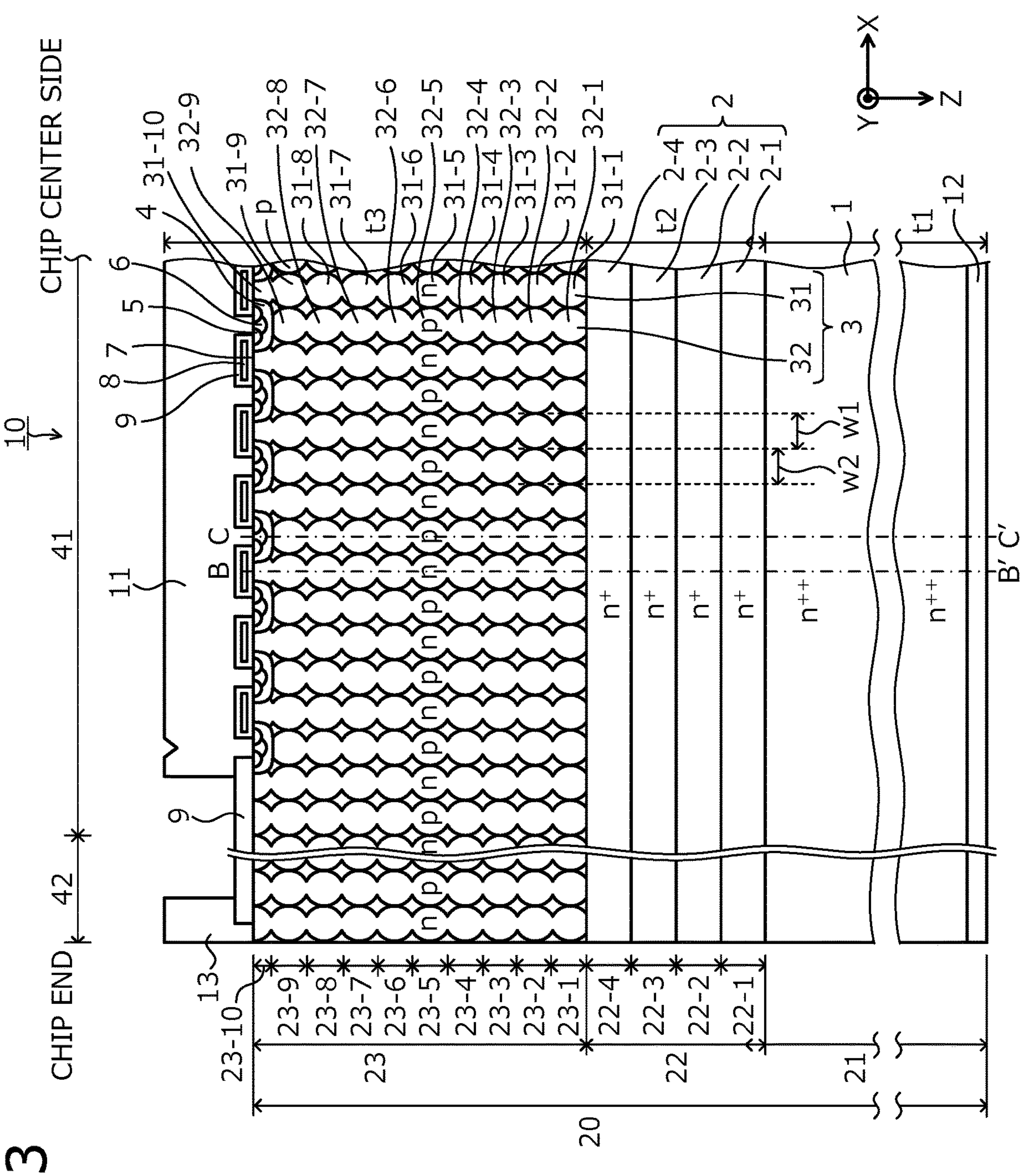
FIG. 3 is a cross-sectional view depicting a structure along cutting line A-A' in FIG. 2.

A structure of a semiconductor device according to an embodiment is described. FIG. 1 is a plan view depicting a layout when the semiconductor device according to the embodiment is viewed from a front side of a semiconductor substrate thereof. FIG. 2 is an enlarged view of a vicinity of a border between an active region and an edge termination region in FIG. 1. FIG. 2 shows an area near a vertex of a semiconductor substrate 20, which has a substantially rectangular shape in the plan view. FIG. 2 shows a layout of a parallel pn layer 3. In FIG. 2, the number of n-type column regions 31 and p-type column regions 32 is simplified and fewer are depicted as compared to FIG. 3. FIG. 3 is a cross-sectional view depicting the structure along cutting line A-A' in FIG. 2.

A semiconductor device 10 according to the embodiment and depicted in FIGS. 1 to 3 is a SJ-MOSFET that has a planar gate structure (device structure) and the parallel pn layer 3 that constitutes a drift layer in the semiconductor substrate (semiconductor chip) 20 that contains silicon (Si) as a semiconductor material. The semiconductor device 10 according to the embodiment, as described hereinafter, has a structure in which an impurity concentration distribution of an n-type buffer layer 2 is adjusted (refer to FIG. 4), whereby cosmic ray (cosmic radiation) tolerance is enhanced. Cosmic rays are streams of particles such as neutrons and heavy particles (particle beams) and correspond to neutron beams on the ground.

When the semiconductor substrate 20 is irradiated with cosmic rays during reverse recovery operation in which main junctions of the MOSFET (the semiconductor device 10) are reverse biased, along irradiation paths of the cosmic rays, electron hole pairs (impact ions) are generated in the depletion layer, and balance of the electric field strength distribution in the semiconductor substrate 20 is lost, whereby the depletion layer rapidly spreads in a direction from the main junctions to the back surface of the semiconductor substrate 20. Impact ions increase due to electric field concentration at locations where the depletion layer is abruptly suppressed, avalanche breakdown occurs, and hole current increases due to the avalanche breakdown, whereby the semiconductor device 10 may be destroyed.

Cosmic ray tolerance is tolerance against a phenomenon that leads to destruction of the semiconductor device 10 due to the avalanche breakdown caused by the impact ions generated by cosmic ray irradiation. For example, cosmic ray tolerance is determined by quantifying the incidence of product destruction, based on the probability of the occurrence of cosmic rays and the number of products (the semiconductor devices 10) destroyed by the cosmic ray irradiation. When cosmic ray tolerance is enhanced, the number of products that are destroyed due to cosmic ray irradiation may be reduced.

Further, even when a product has a breakdown voltage that can withstand normal use, there are products that are destroyed when irradiated with cosmic rays. A product that has a breakdown voltage that can withstand normal use is a product that is not destroyed even when voltage that is about equal to the rated voltage is applied to a drain electrode 12 for a long period. Therefore, a product having a predetermined cosmic ray tolerance may be identified by performing a test to evaluate cosmic ray tolerance with respect to a product (product having a breakdown voltage that can withstand normal use) that is determined to be a conforming product by a general reliability test.

The semiconductor substrate 20 is formed by sequentially forming, by epitaxial growth on a front surface of an $n^{++}$-type starting substrate 21 that contains silicon, semiconductor layers (epitaxial layers) 22, 23 that form the $n^{+}$-type buffer layer 2 and the parallel pn layer 3. The semiconductor substrate 20 has, as the front surface (first main surface), a main surface having the semiconductor layer 23 and a main surface having the $n^{++}$-type starting substrate 21 as the back surface (second main surface). The $n^{++}$-type starting substrate 21 is an $n^{++}$-type drain layer (first semiconductor layer) 1.

The $n^{+}$-type semiconductor layer 22 is the $n^{+}$-type buffer layer (second semiconductor layer) 2. The $n^{+}$-type buffer layer 2 has a function of suppressing the spreading of the depletion during reverse recovery operation, so that the depletion layer, which spreads in the $n^{+}$-type buffer layer 2, in a direction to the $n^{++}$-type drain layer 1, does not reach the $n^{++}$-type drain layer 1. An impurity concentration of the $n^{+}$-type buffer layer 2 is adjusted to be at least equal to an impurity concentration of the n-type column regions 31 of the parallel pn layer 3, in a portion of the $n^{+}$-type buffer layer 2 facing the parallel pn layer 3, the impurity concentration being adjusted to be relatively low so as to approach the impurity concentration of the n-type column regions 31 and to increase closer to the $n^{++}$-type drain layer 1.

The impurity concentration of a portion of the $n^{+}$-type buffer layer 2 facing the parallel pn layer 3 approaches the impurity concentration of the n-type column regions 31, whereby a predetermined breakdown voltage of the semiconductor device 10 is sustained. Further, in the $n^{+}$-type buffer layer 2, an impurity concentration distribution is formed in which the impurity concentration increases closer to the $n^{++}$-type drain layer 1, whereby during reverse recovery operation, the depletion layer, which spreads in the $n^{+}$-type buffer layer 2 in a direction to the $n^{++}$-type drain layer 1, may be suppressed step-wise corresponding to the impurity concentration gradient of the $n^{+}$-type buffer layer 2. Configuration of the $n^{+}$-type buffer layer 2 is described hereinafter.

The semiconductor layer 23 is a drift layer that has a SJ structure in which the parallel pn layer 3 is formed. The parallel pn layer 3 is formed by disposing n-type regions (hereinafter, n-type column regions (first-conductivity-type regions)) 31 and p-type regions (hereinafter, p-type column regions (second-conductivity-type regions)) 32 to be adjacent to one another and to repeatedly alternate with one another in a first direction X that is parallel to the main surfaces of the semiconductor substrate 20. During reverse recovery operation, pn junctions between the p-type column regions 32 and the n-type column regions 31 are reverse biased, whereby the breakdown voltage is sustained.

Further, the drift layer has the SJ structure, whereby, compared to an instance in which a normal drift layer configured by only $n^{-}$-type regions is disposed, the impurity concentration of the drift layer may be increased and thus, the on-resistance is significantly reduced. Further, drift layer has the SJ structure, whereby increases in the on-resistance during high temperature operation are suppressed. High temperature operation is operation of the semiconductor device 10 in a state in which the semiconductor substrate 20 is at a high temperature due to a high temperature environment, application of high voltage, conduction of a large current, etc.

The n-type column regions 31 and the p-type column regions 32 of the parallel pn layer 3, for example, in an entire area of the semiconductor substrate 20, extend in a striped pattern, in a second direction Y that is parallel to the main surfaces of the semiconductor substrate 20 and orthogonal to the first direction X. In the parallel pn layer 3, an outermost one of the n-type column regions 31 is an outermost n-type column region 31*a*. The outermost n-type column region 31*a* is exposed at a side surface of the semiconductor substrate 20 and surrounds a periphery of the parallel pn layer 3 in a substantially rectangular shape in a plane view, along an outer periphery of the semiconductor substrate 20.

Upper ends (ends facing the front surface of the semiconductor substrate 20) of the n-type column regions 31 extend between p-type base regions 4 that are adjacent to one another, the upper ends are in contact with the p-type base regions 4 and reach the front surface of the semiconductor substrate 20. Lower ends (ends facing the back surface of the semiconductor substrate 20) of the n-type column regions 31 are in contact with the $n^{+}$-type buffer layer 2. Upper ends of the p-type column regions 32 reach the p-type base regions 4. Lower ends of the p-type column regions 32 are in contact with the $n^{+}$-type buffer layer 2.

The parallel pn layer 3, for example, as described hereinafter, is formed using a multistage epitaxial method. The multistage epitaxial method is a method in which epitaxial growth of the n-type semiconductor layer 23 that constitutes the drift layer is divided in multiple stages (multiple sessions) and in each stage, p-type regions that constitute the p-type column regions 32 are selectively formed to be adjacent to one another in a depth direction Z by ion-implantation of a p-type impurity in each epitaxially grown layer of the semiconductor layer 23.

The p-type regions constituting the p-type column regions 32 are formed by ion-implanting a p-type impurity into each of the layers of the stages into which the epitaxial growth of the semiconductor layer 23 is divided (here, 10 stages). The p-type base regions 4 formed in a semiconductor layer 23-10 of the uppermost stage and p-type regions 32-9 formed in a semiconductor layer 23-9, which is beneath the semiconductor layer 23-10, suffice to contact one another and the p-type regions that constitute the p-type column regions 32 may be omitted in the semiconductor layer 23-10 of the uppermost stage.

Here, an instance is depicted in which p-type regions 32-1 to 32-9 constituting the p-type column regions 32 are formed, respectively, in semiconductor layers 23-1 to 23-9. The p-type regions 32-1 to 32-9 have a substantially circular shape in a cross-sectional view as a result of the p-type impurity being scattered in a radiating pattern centered around a depth position of the range of each ion implantation. The p-type regions 32-1 to 32-9 adjacent to one another in the depth direction Z are connected with one another, thereby forming the p-type column regions 32.

Impurity concentration distribution of each of the p-type regions 32-1 to 32-9 configuring the p-type column regions 32 exhibits a Gaussian distribution in which a peak concentration (maximum value of the impurity concentration) occurs at the depth position of the range of the ion implantation and the impurity concentration decreases therefrom in directions to the front surface and the back surface of the semiconductor substrate 20. In the impurity concentration distribution (refer to later-described FIG. 5) of the p-type column regions 32, the impurity concentration distribution of the p-type regions 32-1 to 32-9 exhibits a wavy shape continuous in the depth direction Z.

In the semiconductor layer 23, portions thereof between adjacent p-type column regions 32 are free of ion implantation and remain as an n-type to constitute the n-type column regions 31. N-type regions 31-1 to 31-10 that constitute the n-type column regions 31 may be formed by ion implantation of an n-type impurity into each layer into which the semiconductor layer 23 is divided. In this instance, the n-type regions 31-1 to 31-10 have a substantially circular shape in a cross-sectional view as a result of the n-type impurity being scattered in a radiating pattern centered around a depth position of the range of each ion implantation.

Impurity concentration distribution of each of the n-type regions 31-1 to 31-10 configuring the n-type column regions 31 exhibits a Gaussian distribution in which a peak concentration occurs at the depth position of the range of the ion implantation and the impurity concentration decreases therefrom in directions to the front surface and the back surface of the semiconductor substrate 20. In the impurity concentration distribution of the n-type column regions 31 (refer to later-described FIG. 4), the impurity concentration distribution of the n-type regions 31-1 to 31-10 exhibits a wavy shape continuous in the depth direction Z.

Between the n-type column regions 31 and the p-type column regions 32 that are adjacent to one another, pn junctions between the p-type column regions 32 and the n-type column regions 31 are formed at locations where the amount of the n-type impurity scattered from the n-type regions 31-1 to 31-10 and the amount of the p-type impurity scattered from the p-type regions 32-1 to 32-9 are equal to each other. Pn junction surfaces between the p-type column regions 32 and the n-type column regions 31 are substantially orthogonal to the front surface of the semiconductor substrate 20.

Charge balance between the n-type column regions 31 and the p-type column regions 32 that are adjacent to one another is generally maintained. Charge balance is an index that indicates a degree of equilibrium of a charge amount expressed as a product of the carrier concentration (concentration of activated impurity) of the n-type column regions 31 and a width w1 thereof in a transverse direction (the first direction X) and a charge amount expressed as a product of the carrier concentration of the p-type column regions 32 and a width w2 thereof in the transverse direction.

For example, the width w1 of the n-type column regions 31 in the transverse direction and the width w2 of the p-type column regions 32 in the transverse direction are substantially the same (for example, about 4 μm). The impurity concentration of the n-type column regions 31 and the impurity concentration of the p-type column regions 32 are substantially the same. Substantially the same width and substantially the same impurity concentration means, respectively, the same width and the same impurity concentration within a range that includes an allowable error due to process variation.

While not particularly limited hereto, for example, in an instance in which the semiconductor device 10 according to the embodiment has a breakdown voltage of a 650V class, the impurity concentration and the thickness t1 of the $n^{++}$-type drain layer 1 are, for example, about $4.0\times10^{19}/cm^3$ and about 60 μm, respectively. A total thickness t2 of the $n^{+}$-type buffer layer 2 is, for example, 20 μm. A thickness (a length from the front surface of the semiconductor substrate 20 to the $n^{+}$-type buffer layer 2) t3 of the parallel pn layer 3 is, for example, about 40 μm.

Of the n-type regions 31-1 to 31-10 that configure the n-type column regions 31 of the parallel pn layer 3, at least the n-type regions 31-1 that are closest to the $n^{+}$-type buffer layer 2 have a peak concentration of about $1\times10^{16}/cm^3$. Of the p-type regions 32-1 to 32-9 that configure the p-type column regions 32 of the parallel pn layer 3, at least the p-type regions 32-1 that are closest to the $n^{+}$-type buffer layer 2 have a peak concentration of about $1\times10^{16}/cm^3$.

In an active region 41, a planar gate structure is disposed between the front surface of the semiconductor substrate 20 and the parallel pn layer 3. The active region 41 is a region through which a main current flows when the MOSFET (the semiconductor device 10) is in an on-state and is disposed in substantially a center (chip center) of the semiconductor substrate 20. In the active region 41, multiple unit cells (device configuration units) each having a same structure are disposed adjacent to one another. A periphery of the active region 41 is surrounded by an edge termination region 42. Further, in the active region 41, a gate pad 15 to which later-described gate electrodes 8 are electrically connected is provided.

The edge termination region 42 is a region between the active region 41 and an end (chip end) of the semiconductor substrate 20. The edge termination region 42 is provided surrounding the periphery of the active region 41. The edge termination region 42 has a function of mitigating electric field of the drift layer, in the front side of the semiconductor substrate 20, and sustaining the breakdown voltage. The breakdown voltage is a voltage when hole current increases leading to destruction due to the electric field of the front side of the semiconductor substrate 20 increasing and causing avalanche breakdown to occur at locations where the electric field concentrates. The parallel pn layer 3 also constitutes the drift layer of the edge termination region 42.

In the edge termination region 42, the charge balance between the n-type column regions 31 and the p-type column regions 32 suffices to be maintained. Therefore, the parallel pn layer of the edge termination region 42 may be configured by n-type column regions and p-type column regions that have a narrower width in the transverse direction than that of the n-type column regions 31 and the p-type column regions 32. In the edge termination region 42 as well, between the parallel pn layer 3 and the $n^{++}$-type drain layer 1, the $n^{+}$-type buffer layer 2 is provided similarly to the active region 41.

In the edge termination region 42, between the front surface of the semiconductor substrate 20 and the parallel pn layer 3, a voltage withstanding structure (not depicted) such as a field limiting ring (FLR), a junction termination extension (JTE) structure, etc. is disposed. On the front surface of the semiconductor substrate 20, a field stop electrode 13 in contact with the outermost n-type column region 31*a* may be disposed.

The planar gate structure is configured by the p-type base regions 4, $n^{+}$-type source regions 5, $p^{++}$-type contact regions 6, a gate insulating film 7, and the gate electrodes 8. The p-type base regions 4, the $n^{+}$-type source regions 5, and the $p^{++}$-type contact regions 6 are diffused regions formed in surface regions of the semiconductor layer 23 by ion implantation. The p-type base regions 4 are provided in the active region 41, between the front surface of the semiconductor substrate 20 and the p-type column regions 32 of the parallel pn layer 3.

The p-type base regions 4 are in contact with the p-type column regions 32 and extend linearly in the second direction Y along the p-type column regions 32. The n-type column regions 31 of the parallel pn layer 3 extend in portions between the p-type base regions 4 that are adjacent to one another. The p-type base regions 4 and the n-type column regions 31 between the p-type base regions 4 that are adjacent to one another are in contact with the gate insulating film 7 at the front surface of the semiconductor substrate 20 and face the gate electrodes 8 with the gate insulating film 7 intervening therebetween.

The $n^{+}$-type source regions 5 and the $p^{++}$-type contact regions 6 are selectively provided in surface layers of the p-type base regions 4. The $n^{+}$-type source regions 5 and the $p^{++}$-type contact regions 6 are in contact with the p-type base regions 4. The $n^{+}$-type source regions 5 and the $p^{++}$-type contact regions 6, for example, extend linearly in the second direction Y, along the p-type base regions 4. The $n^{+}$-type source regions 5 and the $p^{++}$-type contact regions 6 are in contact with a later-described source electrode 11 at the front surface of the semiconductor substrate 20.

The $n^{+}$-type source regions 5 are in contact with the gate insulating film 7 at the front surface of the semiconductor substrate 20 and face the gate electrodes 8 with the gate insulating film 7 intervening therebetween. The $p^{++}$-type contact regions 6 are disposed farther from the gate electrodes 8 than are the $n^{+}$-type source regions 5. The $p^{++}$-type contact regions 6 are provided in the p-type base regions 4, between the $n^{+}$-type source regions 5 that are adjacent to each other therein. The $p^{++}$-type contact regions 6 may be omitted. In this instance, instead of the $p^{++}$-type contact regions 6, the p-type base regions 4 are in contact with the source electrode 11, at the front surface of the semiconductor substrate 20.

On the front surface of the semiconductor substrate 20, the gate electrodes 8 are provided via the gate insulating film 7. Further, in an entire area of the front surface of the semiconductor substrate 20, an interlayer insulating film 9 is provided so as to cover the gate electrodes 8. In contact holes that penetrate through the interlayer insulating film 9 in the depth direction Z, the $n^{+}$-type source regions 5 and the $p^{++}$-type contact regions 6 (in an instance in which the $p^{++}$-type contact regions 6 are omitted, the p-type base regions 4) are exposed.

The source electrode (first electrode) 11, via contact holes of the interlayer insulating film 9, is in ohmic contact with the front surface of the semiconductor substrate 20 and is electrically connected to the p-type base regions 4, the $n^{+}$-type source regions 5, and the $p^{++}$-type contact regions 6. The drain electrode (second electrode) 12 is provided in an entire area of the back surface of the semiconductor substrate 20 (back surface of the $n^{++}$-type starting substrate 21) and is electrically connected to the $n^{++}$-type drain layer 1 (the $n^{++}$-type starting substrate 21).

Figure 4:
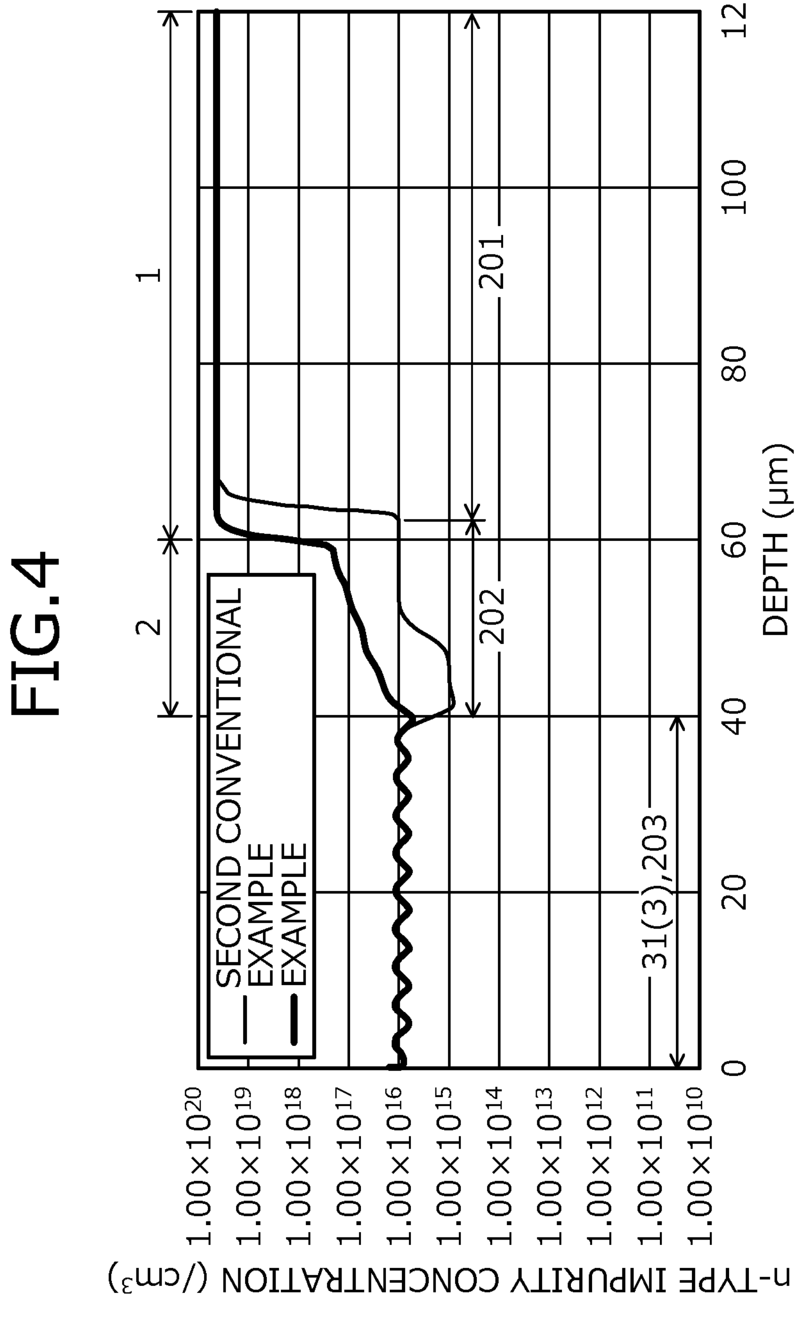
FIG. 4 is a characteristics diagram depicting n-type impurity concentration distribution of the semiconductor substrate depicted in FIG. 3.
Figures 5, 6:
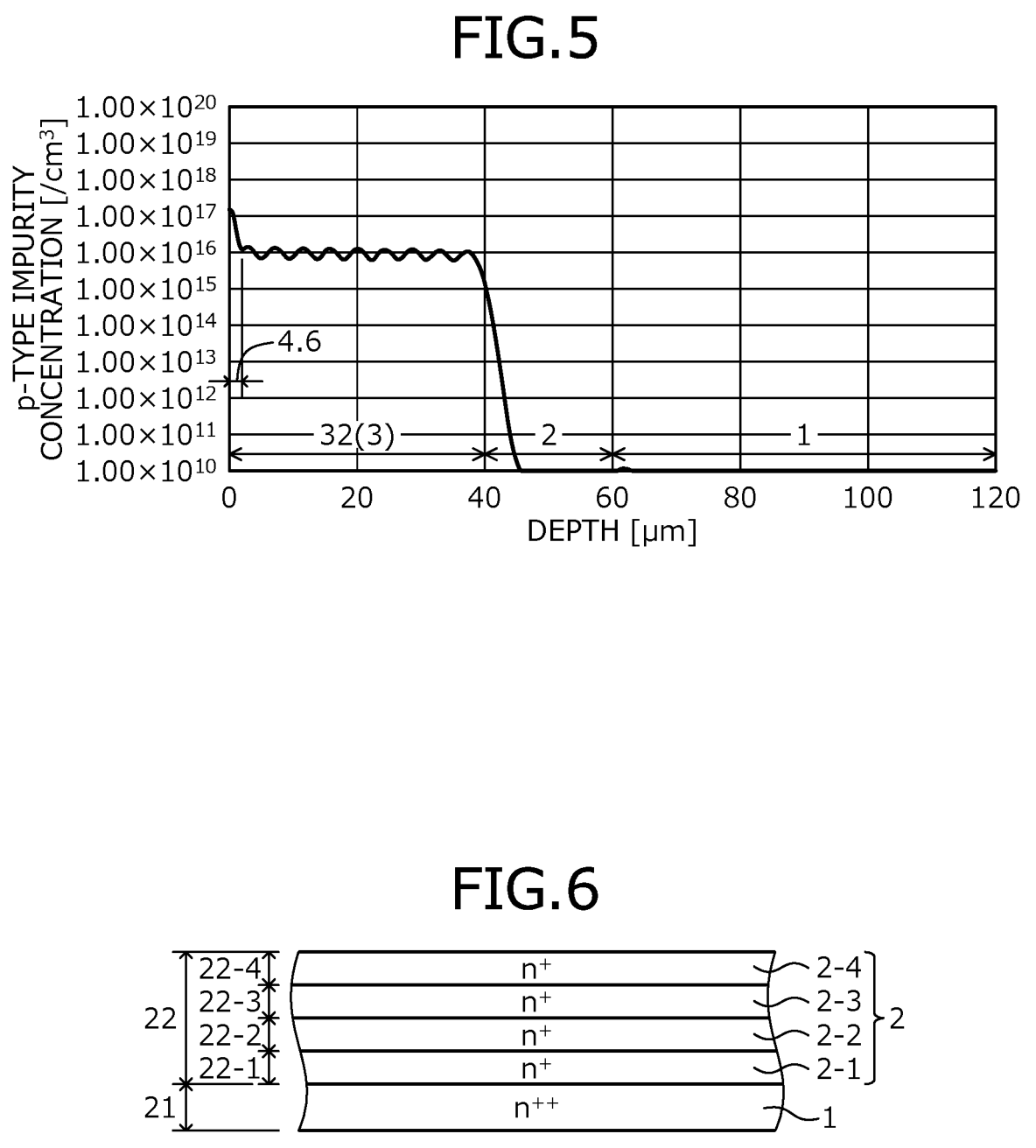

Configuration of the $n^{+}$-type buffer layer 2 is described. FIGS. 4 and 5 are characteristics diagrams, respectively, depicting n-type impurity concentration distribution and p-type impurity concentration distribution of the semiconductor substrate (later-described example) depicted in FIG. 3. FIG. 4 depicts impurity concentration distribution of the n-type column regions 31, the $n^{+}$-type buffer layer 2, and the $n^{++}$-type drain layer 1, along cutting line B-B' in FIG. 3. FIG. 5 depicts impurity concentration distribution of the $p^{++}$-type contact regions 6, the p-type base regions 4, and the p-type column regions 32, along cutting line C-C' in FIG. 3. In FIGS. 4 and 5, a horizontal axis indicates depth from the front surface of the semiconductor substrate 20 and a vertical axis indicates impurity concentration.

The impurity concentration of the $n^{+}$-type buffer layer 2 is at least equal to the impurity concentration of the n-type column regions 31 and increases in the depth direction Z as the proximity to the $n^{++}$-type drain layer 1 increases. That is, the impurity concentration of a point in the $n^{+}$-type buffer layer 2 increases as the point approaches the $n^{++}$-type drain layer 1. Change of the impurity concentration distribution of the $n^{+}$-type buffer layer 2 in the depth direction (increase in a direction to the $n^{++}$-type drain layer 1) may be a narrow monotonic increase in which the impurity concentration increases as it approaches the $n^{++}$-type drain layer 1, the impurity concentration increasing by one or more successive predetermined gradients (preferably one predetermined gradient).

In the $n^+$-type buffer layer 2, impurity concentration distribution having the described predetermined gradient is formed, whereby during reverse recovery operation, in the $n^+$-type buffer layer 2, change of the electric field strength distribution in the depth direction Z becomes gradual corresponding to the impurity concentration gradient of the $n^+$-type buffer layer 2. Therefore, during reverse recovery operation, acceleration and increase of impact ions due to electric field in the $n^+$-type buffer layer 2 may be suppressed, said impact ions being generated by cosmic ray irradiation. The effect of suppressing increases of the impact ions is increased the more uniform the impurity concentration gradient is throughout the $n^+$-type buffer layer 2.

The impurity concentration distribution of the $n^+$-type buffer layer 2 may be adjusted so that the depletion layer, which spreads in the $n^+$-type buffer layer 2, toward the $n^{++}$-type drain layer 1 during reverse recovery operation, is suppressed stepwise in a direction to the $n^{++}$-type drain layer 1. Therefore, change of the impurity concentration distribution of the $n^+$-type buffer layer 2 in the depth direction Z (increase in direction to the $n^{++}$-type drain layer 1) may be a broad monotonic increase in which a portion where the impurity concentration increases by the predetermined gradient and a portion where the impurity concentration does not change (no gradient) are both present.

Further, the impurity concentration of the $n^+$-type buffer layer 2 is adjusted so that close to a interface between the $n^+$-type buffer layer 2 and the $n^{++}$-type drain layer 1, a difference of the impurity concentration of the $n^+$-type buffer layer 2 and the impurity concentration of the $n^{++}$-type drain layer 1 becomes as small as possible. As a result, the depletion layer, which rapidly spreads due to cosmic ray irradiation during reverse recovery operation, may be prevented from being rapidly suppressed at the interface between the $n^+$-type buffer layer 2 and the $n^{++}$-type drain layer 1. Therefore, local concentration of electric field at the interface between the $n^+$-type buffer layer 2 and the $n^{++}$-type drain layer 1 is suppressed and the occurrence of avalanche breakdown may be suppressed.

The impurity concentration of the $n^+$-type buffer layer 2 is adjusted so that at least the difference of the impurity concentration of the $n^+$-type buffer layer 2 and the impurity concentration of the $n^{++}$-type drain layer 1 is reduced to an extent that avalanche breakdown does not occur at the interface between the $n^+$-type buffer layer 2 and the $n^{++}$-type drain layer 1 due to rapid spreading of the depletion layer due to cosmic ray irradiation during reverse recovery operation. In particular, the impurity concentration of the $n^+$-type buffer layer 2 suffices to be at least $\frac{1}{200}$ times the impurity concentration of the $n^{++}$-type drain layer 1, at the interface between the $n^+$-type buffer layer 2 and the $n^{++}$-type drain layer 1.

The impurity concentration distribution of the $n^+$-type buffer layer 2 described above, for example, may be formed by assuming a stacked structure for the $n^+$-type buffer layer 2 in which multiple stages (here, 4 stages) of buffer layers (here, reference numerals 2-1 to 2-4 sequentially from the $n^{++}$-type drain layer 1 side) of differing impurity concentrations are stacked. The $n^+$-type buffer layers (first-conductivity-type layers) 2-1 to 2-4 are formed sequentially on the $n^{++}$-type starting substrate 21 by epitaxial growth and constitute $n^+$-type semiconductor layers 22-1 to 22-4 that configure the $n^+$-type semiconductor layer 22.

The $n^+$-type semiconductor layer 22, immediately after epitaxial growth, has an impurity concentration distribution in which the impurity concentration changes stepwise due to the $n^+$-type semiconductor layers 22-1 to 22-4, which each has a different impurity concentration that is uniform in the depth direction (has no gradient). By a heat treatment performed when the parallel pn layer 3 is formed thereafter, an n-type impurity is mutually diffused between the $n^+$-type semiconductor layers 22-1 to 22-4 that are adjacent to one another in the depth direction Z and a predetermined impurity concentration gradient is formed in the $n^+$-type semiconductor layer 22.

The impurity concentration difference between the $n^+$-type buffer layers 2-1 to 2-4 that are adjacent to one another in the depth direction Z, for example, is at most about threefold and may be as small as possible. The amount of change in the impurity concentration between the $n^+$-type buffer layers 2-1 to 2-4 that are adjacent to one another in the depth direction Z is reduced, whereby local electric field concentration at the interface between the $n^+$-type buffer layers 2-1 to 2-4 that are adjacent to one another in the depth direction Z may be suppressed.

When the impurity concentration difference between the $n^+$-type buffer layer 2-1 of the first stage (closest to the $n^{++}$-type drain layer 1) and the $n^{++}$-type drain layer 1 is extremely large, electric field concentrates at the interface between the $n^+$-type buffer layer 2 and the $n^{++}$-type drain layer 1 and avalanche breakdown occurs. Therefore, the impurity concentration of the $n^+$-type buffer layer 2-1 of the first stage is adjusted so that the impurity concentration difference between the $n^+$-type buffer layer 2-1 and the $n^{++}$-type drain layer 1 is reduced to an extent that avalanche breakdown does not occur at the interface between the $n^+$-type buffer layer 2 and the $n^{++}$-type drain layer 1.

When the impurity concentration difference between the $n^+$-type buffer layer 2-4 of the fourth stage (closest to the parallel pn layer 3) and the n-type column regions 31 is large, electric field concentrates at the interface between the $n^+$-type buffer layer 2 and the n-type column regions 31, avalanche breakdown occurs, and the breakdown voltage decreases. Therefore, the impurity concentration of the $n^+$-type buffer layer 2-4 of the fourth stage is adjusted so that the impurity concentration difference between the $n^+$-type buffer layer 2-4 and the n-type column regions 31 is reduced to an extent that avalanche breakdown does not occur at the interface between the $n^+$-type buffer layer 2 and the n-type column regions 31.

As the $n^+$-type buffer layer 2, three or more stages of $n^+$-type semiconductor layers of different impurity concentrations formed by epitaxial growth may be stacked, or four or more stages of $n^+$-type semiconductor layers may be stacked. A greater number of stages (i.e., the number of stacked $n^+$-type semiconductor layers constituting the $n^+$-type semiconductor layer 22) of the $n^+$-type buffer layer 2 facilitates adjustment of a narrow monotonic increase or a broad monotonic increase of the impurity concentration distribution of the $n^+$-type buffer layer 2.

Further, as depicted in later-described FIG. 4, while the $n^+$-type buffer layer 202 of a second conventional example is formed by stacking two stages of $n^+$-type semiconductor layers formed by epitaxial growth, the n-type buffer layer on the $n^{++}$-type drain layer 201 side has a thickness that is thin for bearing cosmic ray tolerance and the impurity concentration difference between the n-type buffer layer and the $n^{++}$-type drain layer 201 is large. Furthermore, from the results depicted in later-described FIG. 22, it was confirmed that in the second conventional example, avalanche breakdown occurs due to electric field concentrating at the n-type buffer layer 202 and hole current is locally amplified, leading to destruction.

The $n^+$-type buffer layer 2 (i.e., the $n^+$-type semiconductor layer 22) has a multilayer structure of three or more stages of $n^+$-type semiconductor layers of different impurity concentrations and is formed by epitaxial growth, whereby the problem that occurs with the second conventional example described above is less likely to occur. Therefore, as the $n^+$-type buffer layer 2, desirably, three or more stages of $n^+$-type semiconductor layers of different impurity concentrations formed by epitaxial growth may be stacked, or four or more stages of $n^+$-type semiconductor layers may be stacked.

In particular, for example, in an instance in which the $n^+$-type buffer layer 2 has a four-stage structure, the impurity concentration of the $n^+$-type buffer layer 2-1 of the first stage is in a range of about $1.0\times10^{17}/cm^3$ to $5.0\times10^{17}/cm^3$. The impurity concentration of the $n^+$-type buffer layer 2-2 of the second stage is in a range of about $5.0\times10^{16}/cm^3$ to $2.0\times10^{17}/cm^3$. The impurity concentration of the $n^+$-type buffer layer 2-3 of the third stage is in a range of about $1.5\times10^{16}/cm^3$ to $7.0\times10^{16}/cm^3$.

The impurity concentration of the $n^+$-type buffer layer 2-4 of the fourth stage is in a range of about $1.5\times10^{16}/cm^3$ to $3.0\times10^{16}/cm^3$. While not particularly limited hereto, in an instance in which the semiconductor device 10 according to the embodiment has a breakdown voltage of a 650V class, the impurity concentrations of the $n^+$-type buffer layers 2-1 to 2-4 are about $2.0\times10^{17}/cm^3$, about $1.0\times10^{17}/cm^3$, about $5.0\times10^{16}/cm^3$, and about $2.0\times10^{16}/cm^3$, respectively.

In this instance, the impurity concentration difference between the $n^+$-type buffer layers 2-1 to 2-4 that are adjacent to one another in the depth direction Z is in a range of about 2 times to 2.5 times. In this manner, on the $n^{++}$-type starting substrate 21, the $n^+$-type buffer layers 2-1 to 2-4 of multiple stages are sequentially formed in ascending order of impurity concentration by epitaxial growth and configure the $n^+$-type buffer layer 2, whereby the impurity concentration of the $n^+$-type buffer layer 2 may be increased as the proximity to the $n^{++}$-type drain layer 1 increases.

FIG. 4, for comparison, depicts the n-type impurity concentration distribution of the n-type buffer layer 202 of the later-described second conventional example. While the n-type buffer layer 202 of the second conventional example has a two-layer structure, only the n-type buffer layer facing the $n^{++}$-type drain layer 201 has an impurity concentration that is higher than that of n-type column regions of a parallel pn layer 203 and acts to enhance cosmic ray tolerance. Nonetheless, the n-type buffer layer facing the $n^{++}$-type drain layer 201 has a thickness that is thin for bearing cosmic ray tolerance and the impurity concentration difference between the n-type buffer layer and the $n^{++}$-type drain layer 201 is large.

In particular, the n-type buffer layer 202 of the second conventional example has the same configuration as that of the n-type buffer layer of International Publication No. WO 2015/040938. In other words, the n-type buffer layer 202 of the second conventional example is formed by two-stage epitaxial growth; the thickness and the impurity concentration of the n-type buffer layer facing the parallel pn layer 203 are 9 μm and $1.0\times10^{15}/cm^3$, respectively; and the thickness and the impurity concentration of the n-type buffer layer facing the $n^{++}$-type drain layer 201 are 15 μm and $1.0\times10^{16}/cm^3$, respectively. A total thickness of the n-type buffer layer 202 of the second conventional example is 24 μm.

On the other hand, in the example, the impurity concentration difference between the $n^+$-type buffer layers 2-1 to 2-4 that are adjacent to one another in the depth direction Z is adjusted to be three times or less. As a result, in the $n^+$-type buffer layer 2, an impurity concentration distribution is formed in which the impurity concentration increases as the proximity to the $n^{++}$-type drain layer 1 increases, and at the interface between the $n^+$-type buffer layer 2 and the $n^{++}$-type drain layer 1, the impurity concentration difference between the $n^+$-type buffer layer 2 and the $n^{++}$-type drain layer 1 is relatively small.

As described above, in an instance in which the semiconductor device 10 according to the embodiment has a breakdown voltage of a 650V class, the impurity concentration of the $n^+$-type buffer layer 2-1 is about $2.0\times10^{17}/cm^3$ and the impurity concentration of the $n^{++}$-type drain layer 1 is about $4.0\times10^{19}/cm^3$. Therefore, the impurity concentration of the $n^+$-type buffer layer 2 may be adjusted to be at least 1/200 times the impurity concentration of the $n^{++}$-type drain layer 1 at the interface between the $n^+$-type buffer layer 2 and the $n^{++}$-type drain layer 1.

In an instance in which the $n^+$-type buffer layers 2-1 to 2-4 all have substantially the same thickness, the respective thicknesses of the $n^+$-type buffer layers 2-1 to 2-4 are each a thickness (about 5 μm) obtained by equally dividing the total thickness t2 (about 20 μm) of the $n^+$-type buffer layer 2 by the number of stages of the stacked structure of the $n^+$-type buffer layer 2 (i.e., 4 equal portions). Substantially the same thickness means the same thickness within a range that includes an allowable error due to process variation. The thicknesses of each of the $n^+$-type buffer layers 2-1 to 2-4 may differ from one another.

Operation of the semiconductor device 10 according to the embodiment is described. When voltage that is at least equal to a gate threshold voltage is applied to the gate electrodes 8 during a state in which voltage that is positive with respect to the source electrode 11 is applied to the drain electrode 12, in portions of the p-type base regions 4 sandwiched between the $n^+$-type source regions 5 and the n-type column regions 31, a channel (n-type inversion layer) is formed. As a result, the main current (drift current) flows from the $n^{++}$-type drain layer 1, through the channel, to the $n^+$-type source regions 5 and the MOSFET (the semiconductor device 10) turns ON.

On the other hand, when voltage that is less than the gate threshold voltage is applied to the gate electrodes 8 during the state in which voltage that is positive with respect to the source electrode 11 is applied to the drain electrode 12, pn junctions (main junctions of the MOSFET) between the p-type base regions 4 and the n-type column regions 31 are reverse biased. Due to reverse recovery operation of parasitic diodes (body diodes) formed by the pn junctions, the main current of the MOSFET stops flowing and the MOSFET maintains the off-state. During this reverse recovery operation, a depletion layer spreads in the n-type column regions 31 of the parallel pn layer 3, from the pn junctions, and a predetermined breakdown voltage is sustained.

Further, during the reverse recovery operation, the breakdown voltage is borne by the pn junctions between the p-type column regions 32 and the n-type column regions 31 being reverse biased, and the depletion layer spreading throughout the parallel pn layer 3 and in the $n^+$-type buffer layer 2, from the pn junctions. As a result, a predetermined breakdown voltage is sustained that exceeds the breakdown voltage that can be realized by the impurity concentration of the drift layer (the n-type column regions 31). Further, spreading of the depletion layer in the $n^+$-type buffer layer 2, in a direction to the $n^{++}$-type drain layer 1 is suppressed stepwise corresponding to the impurity concentration gradient of the $n^+$-type buffer layer 2 and may be suppressed in the entire $n^+$-type buffer layer 2.

Figure 7:
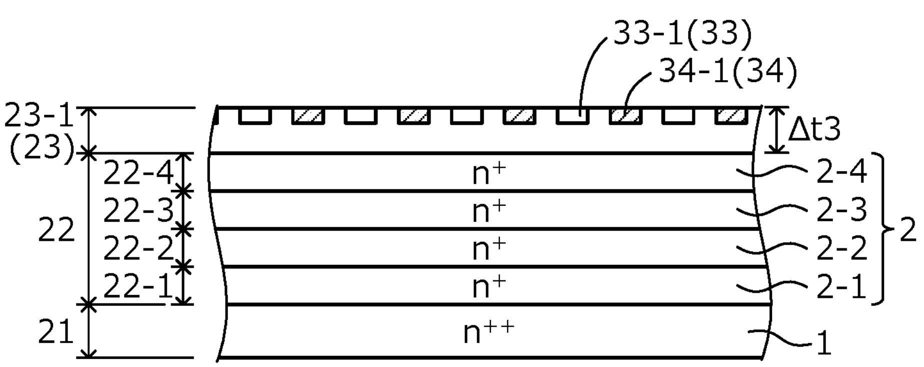
FIG. 7 is a cross-sectional view depicting a state of the semiconductor device according to the embodiment during manufacture.
Figure 8:
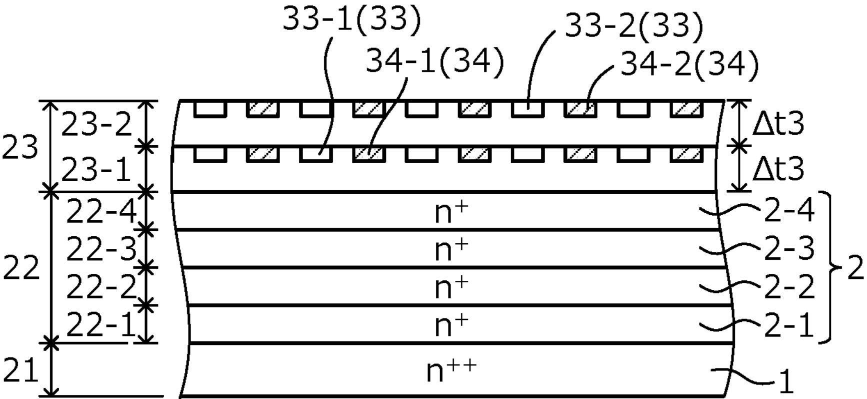
FIG. 8 is a cross-sectional view depicting a state of the semiconductor device according to the embodiment during manufacture.
Figure 9A:
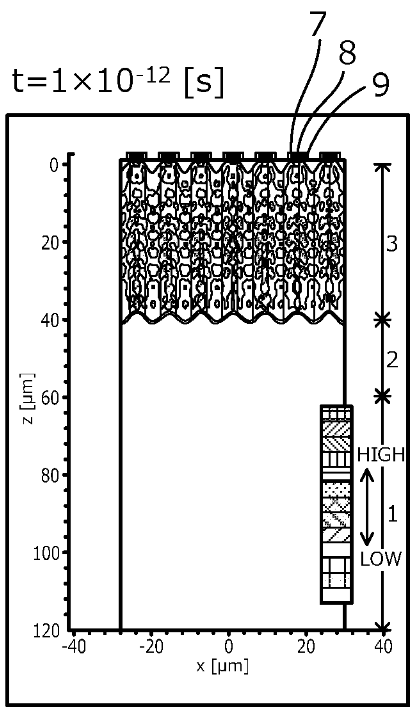
FIG. 9A is a cross-sectional view schematically depicting a state of impact ions in a semiconductor substrate of an example.
Figure 9B:
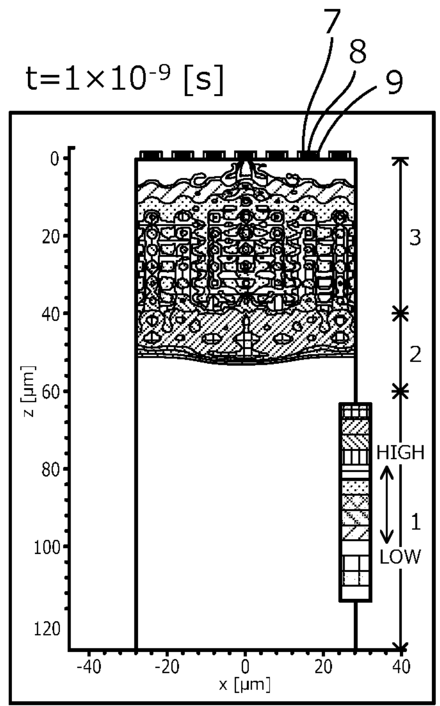
FIG. 9B is a cross-sectional view schematically depicting a state of impact ions in the semiconductor substrate of the example.
Figure 9C:
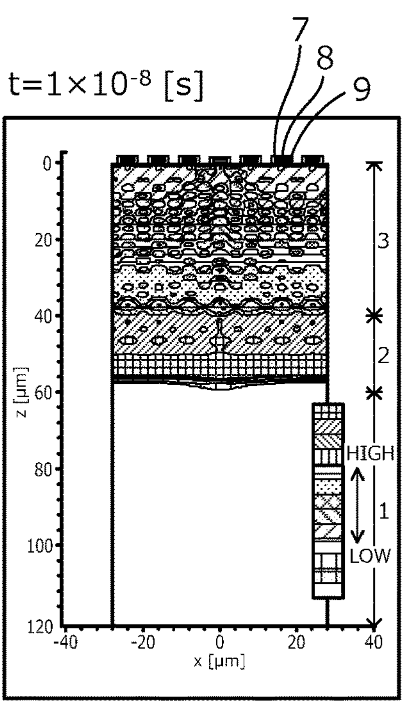
FIG. 9C is a cross-sectional view schematically depicting a state of impact ions in the semiconductor substrate of the example.
Figure 9D:
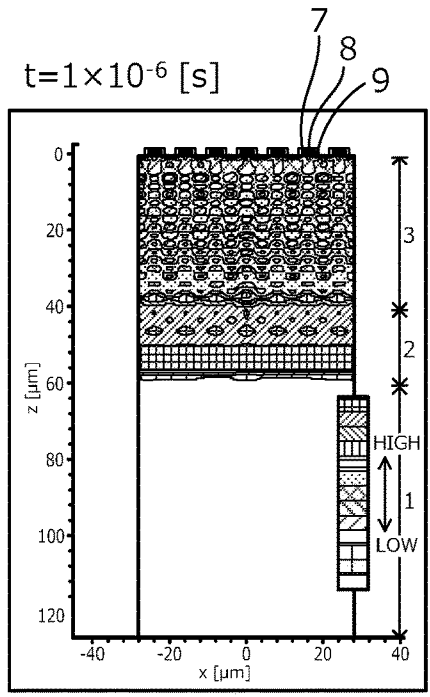
FIG. 9D is a cross-sectional view schematically depicting a state of impact ions in the semiconductor substrate of the example.

A method of manufacturing the semiconductor device 10 according to the embodiment is described. FIGS. 6, 7, and 8 are cross-sectional views depicting states of the semiconductor device according to the embodiment during manufacture. FIGS. 6 to 8 depict a state after formation of the $n^+$-type buffer layer 2 and a state during formation of the parallel pn layer 3 (regarding other structures, refer to FIGS. 2 and 3). In FIGS. 6 to 8, the $n^{++}$-type starting substrate 21 is simplified and the thickness t1 is depicted thinner than that of the $n^{++}$-type starting substrate 21 in FIG. 3.

First, as depicted in FIG. 6, on the front surface of the $n^+$-type starting substrate (semiconductor wafer) 21, which constitutes the $n^{++}$-type drain layer 1, the $n^+$-type semiconductor layer 22, which constitutes the $n^+$-type buffer layer 2, is formed. In particular, the $n^+$-type semiconductor layers 22-1 to 22-4, which constitute the $n^+$-type buffer layers 2-1 to 2-4 that configure the $n^+$-type buffer layer 2 are sequentially formed by epitaxial growth. The $n^+$-type semiconductor layers 22-1 to 22-4, at this time, are each formed having different impurity concentrations. The impurity concentration distribution of the $n^+$-type semiconductor layers 22-1 to 22-4 in the depth direction Z is uniform in each of the $n^+$-type semiconductor layers 22-1 to 22-4.

Next, for example, the parallel pn layer 3, which constitutes the drift layer, is formed using the multistage epitaxial method. In particular, as depicted in FIG. 7, on the $n^+$-type semiconductor layer 22, the n-type semiconductor layer 23 (23-1), which constitutes the drift layer, is epitaxially grown and has the predetermined thickness Δt3. Next, by photolithography and ion implantation of a p-type impurity such as, for example, aluminum (Al), in the semiconductor layer 23-1, p-type implanted regions 33 (33-1) are selectively formed at positions where the p-type column regions 32 are to be formed.

Next, as depicted in FIG. 8, on the semiconductor layer 23-1, the semiconductor layer 23-2 is epitaxially grown and has the predetermined thickness Δt3, whereby the thickness of the semiconductor layer 23 is increased. Next, by photolithography and ion implantation of a p-type impurity such as, for example, aluminum, in the portion (the semiconductor layer 23-2) by which the thickness of the semiconductor layer 23 is increased, the p-type implanted regions 33 (33-2) are selectively formed at positions where the p-type column regions 32 are to be formed.

In this manner, in each of the multiple stages (here, 10 stages) of epitaxial growth performed until the final thickness t3 of the semiconductor layer 23 is achieved, in each of the semiconductor layers 23-1 to 23-10 of the multiple stages, the p-type implanted regions 33 (here, only the p-type implanted regions 33-1, 33-2 formed, respectively, in the semiconductor layers 23-1, 23-2 are depicted) are selectively formed at positions (in FIG. 3, corresponds to positions where the p-type regions 32-1 to 32-9 are formed) where the p-type column regions 32 are to be formed. The semiconductor layers 23-1 to 23-10, for example, are each formed to have the thickness Δt3, which is obtained by equally dividing the final thickness t3 of the parallel pn layer 3 by the number of stages.

Further, in each of the stages of epitaxial growth of the n-type semiconductor layer 23, in each of the semiconductor layers 23-1 to 23-10 formed by the epitaxial growth, n-type implanted regions 34 (here, only n-type implanted regions 34-1, 34-2 formed, respectively, in the semiconductor layers 23-1, 23-2 are depicted) are formed by ion-implanting an n-type impurity such as, for example, phosphorus (P) or arsenic (As), at positions (in FIG. 3, corresponds to the positions where the n-type regions 31-1 to 31-10 are formed) where the n-type column regions 31 are to be formed. Next, a heat treatment for diffusing the impurities ion-implanted in the semiconductor layer 23 is performed.

By this heat treatment, the p-type implanted regions 33 of the semiconductor layers 23-1 to 23-10 adjacent to one another in the depth direction Z are connected with one another. The p-type implanted regions 33 formed in each of the semiconductor layers 23-1 to 23-10 have, in a cross-sectional view, a substantially circular shape formed by the p-type impurity being scattered in a radiating pattern centered around the depth position of the range of each of the ion implantations. As a result, the p-type regions 32-1 to 32-9 depicted in FIG. 3 are formed; the p-type regions 32-1 to 32-9 that are in contact with one another in the depth direction Z are connected with one another, thereby forming the p-type column regions 32.

Further, by this heat treatment, the n-type implanted regions 34 of the semiconductor layers 23-1 to 23-10 that are adjacent to one another in the depth direction Z are connected with one another. The n-type implanted regions 34 formed in each of the semiconductor layers 23-1 to 23-10 have, in a cross-sectional view, a substantially circular shape formed by the n-type impurities being scattered in a radiating pattern centered around the depth position of the range of each of the ion implantations. As a result, the n-type regions 31-1 to 31-10 depicted in FIG. 3 are formed and the n-type regions 31-1 to 31-10 adjacent to one another in the depth direction Z are connected with one another, thereby forming the n-type column regions 31.

While FIGS. 7 and 8 depict a method of forming the parallel pn layer 3 in an instance in which the n-type implanted regions 34 are formed in each of the semiconductor layers 23-1 to 23-10, formation of the n-type implanted regions 34 may be omitted, the n-type semiconductor layers 23-1 to 23-10 may be formed having the same impurity concentration as that of the n-type column regions 31 by multistage epitaxial growth, and the n-type regions between the p-type column regions 32 that are adjacent to one another is free of ion implantation so as to be left as the n-type column regions 31.

Further, as described above, the impurity concentration distribution in the depth direction Z during the epitaxial growth of the $n^+$-type semiconductor layers 22-1 to 22-4 that are epitaxially grown to have mutually different impurity concentrations is uniform in each of the $n^+$-type semiconductor layers 22-1 to 22-4; however, due to the heat treatment, the n-type impurity mutually diffuses between the $n^+$-type semiconductor layers 22-1 to 22-4 that are adjacent to one another in the depth direction Z.

As a result, the $n^+$-type buffer layer 2 is formed having an impurity concentration distribution in which the impurity concentration gradually increases from a lower portion (upper surface of the $n^+$-type semiconductor layer 22-4) of the parallel pn layer 3 to the $n^{++}$-type drain layer 1. In each of the $n^+$-type buffer layers 2-1 to 2-4 (the $n^+$-type semiconductor layer 22-1 to 22-4), a predetermined impurity concentration gradient is formed, and an impurity concentration distribution is formed in which the impurity concentration increases by a narrow monotonic increase or a broad monotonic increase throughout the $n^+$-type buffer layer 2 as the proximity to the $n^{++}$-type drain layer 1 increases (refer to FIG. 4).

By the processes up to here, the semiconductor substrate 20 in which the semiconductor layers 22, 23 are sequentially stacked on the $n^+$-type starting substrate 21 is completed. Next, by a general method, the p-type base regions 4, the $n^+$-type source regions 5, the $p^{++}$-type contact regions 6, the gate insulating film 7, the gate electrodes 8, the interlayer insulating film 9, the gate pad 15, the source electrode 11, and the drain electrode 12 are formed. Thereafter, the semiconductor wafer (the semiconductor substrate 20) is diced (cut) into individual chips, whereby the semiconductor device 10 depicted in FIGS. 1 to 3 is completed.

As described above, according to the embodiment, the impurity concentration of the $n^+$-type buffer layer is at least equal to the impurity concentration of the n-type column regions of the parallel pn layer, and on the parallel pn layer side thereof, is adjusted to be relatively low so as to approach the impurity concentration of n-type column regions and increase as the proximity to the $n^{++}$-type drain layer increases. The impurity concentration of the $n^+$-type buffer layer approaches the impurity concentration of the n-type column regions (drift layer) of the parallel pn layer in the parallel pn layer side of the $n^+$-type buffer layer, whereby local concentration of electric field at the interface between the parallel pn layer side of the $n^+$-type buffer layer and the $n^+$-type buffer layer is suppressed, and the predetermined breakdown voltage of the semiconductor device is sustained.

In the $n^+$-type buffer layer, an impurity concentration distribution is formed in which the impurity concentration increases as the proximity to the $n^{++}$-type drain layer increases, whereby even when the depletion layer rapidly spreads in the semiconductor substrate to the $n^{++}$-type drain layer side of the $n^+$-type buffer layer due to cosmic ray irradiation during reverse recovery operation, the spreading of the depletion layer is suppressed stepwise corresponding to the impurity concentration gradient of the $n^+$-type buffer layer and may be suppressed throughout the $n^+$-type buffer layer. As a result, rapid suppression of the depletion layer may be prevented and thus, local concentration of electric field may be suppressed.

Further, in the $n^+$-type buffer layer, the impurity concentration distribution is formed in which the impurity concentration increases as the proximity to the $n^{++}$-type drain layer increases, whereby the impurity concentration of the $n^+$-type buffer layer may be adjusted so that the impurity concentration difference between the $n^+$-type buffer layer and the $n^{++}$-type drain layer in a vicinity close to the interface between the $n^+$-type buffer layer and the $n^{++}$-type drain layer is as small as possible. As a result, at the interface between the $n^+$-type buffer layer and the $n^{++}$-type drain layer, rapid suppression of the depletion layer may be prevented and thus, local concentration of electric field may be suppressed.

In this manner, local concentration of electric field is suppressed, whereby increase of impact ions may be suppressed and thus, avalanche breakdown may be suppressed. As a result, cosmic ray tolerance may be enhanced without making the thickness of the $n^+$-type buffer layer extremely thick. Further, according to the embodiment, in the $n^+$-type buffer layer, the impurity concentration distribution is formed in which the impurity concentration increases as the proximity to the $n^{++}$-type drain layer increases, whereby cosmic ray tolerance is enhanced, and conduction loss may be reduced.

Figure 10:
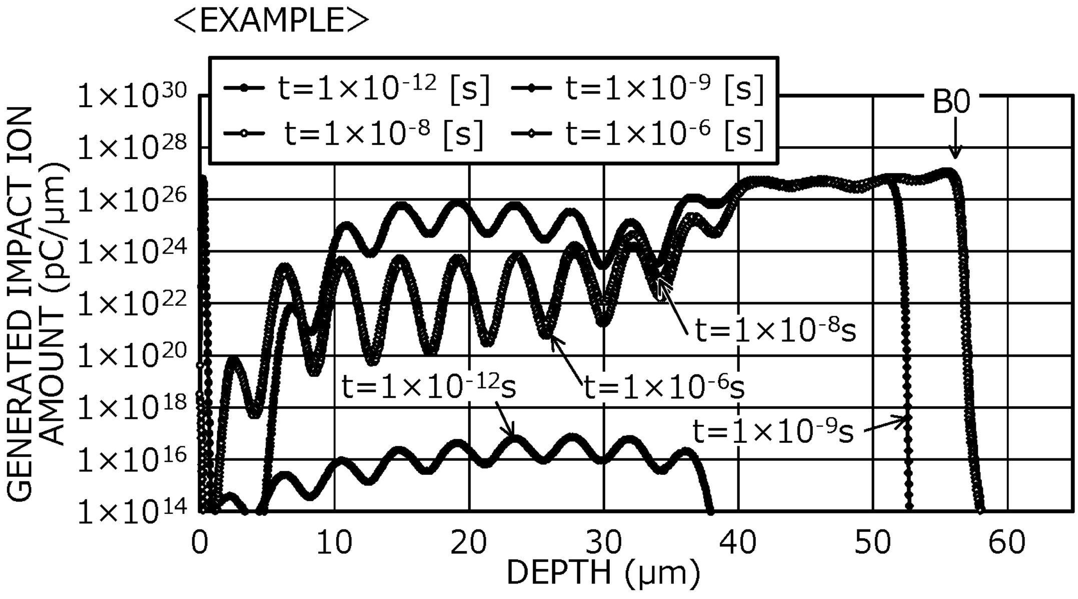
FIG. 10 is a characteristics diagram depicting impact ion generation amount distribution at x=0[μm] in FIGS. 9A to 9D.
Figure 11A:
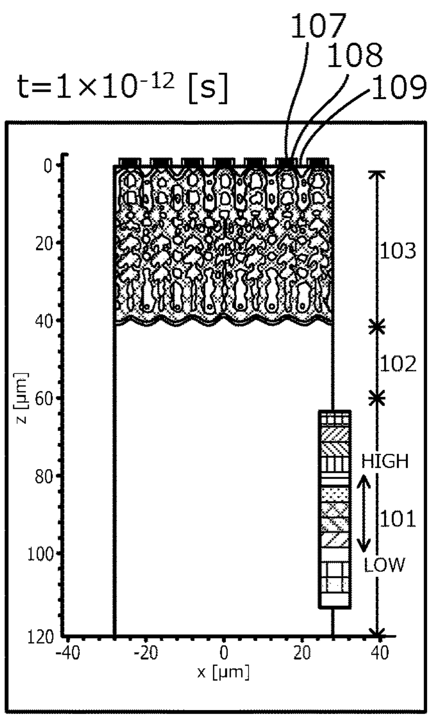
FIG. 11A is a cross-sectional view schematically depicting a state of impact ions in a semiconductor substrate of a first conventional example.
Figure 11B:
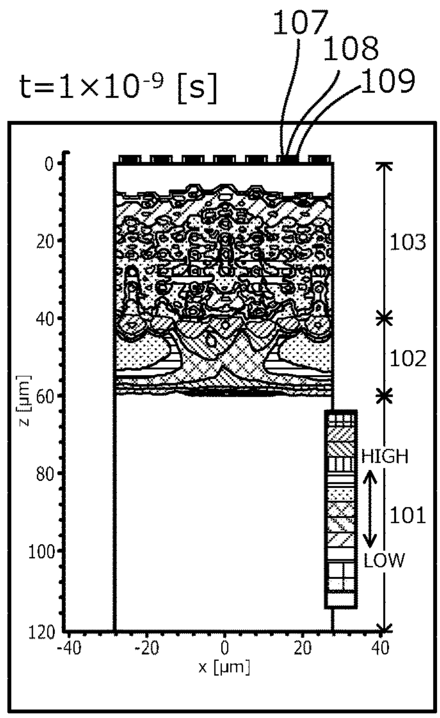
FIG. 11B is a cross-sectional view schematically depicting a state of impact ions in the semiconductor substrate of the first conventional example.
Figure 11C:
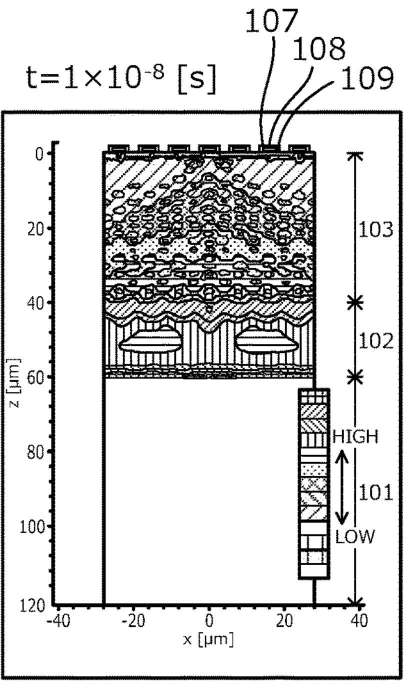
FIG. 11C is a cross-sectional view schematically depicting a state of impact ions in the semiconductor substrate of the first conventional example.
Figure 11D:
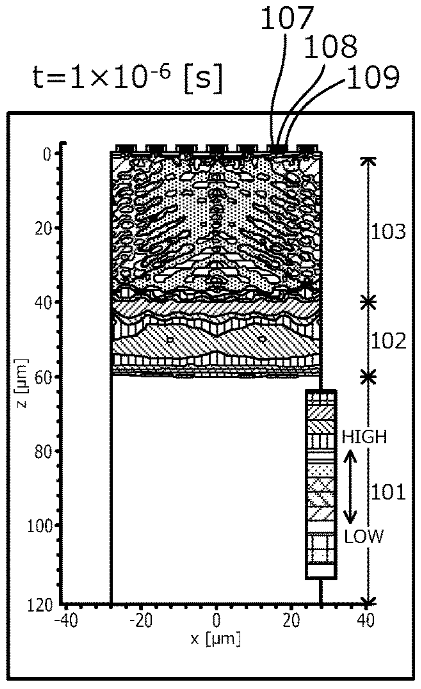
FIG. 11D is a cross-sectional view schematically depicting a state of impact ions in the semiconductor substrate of the first conventional example.
Figure 12:
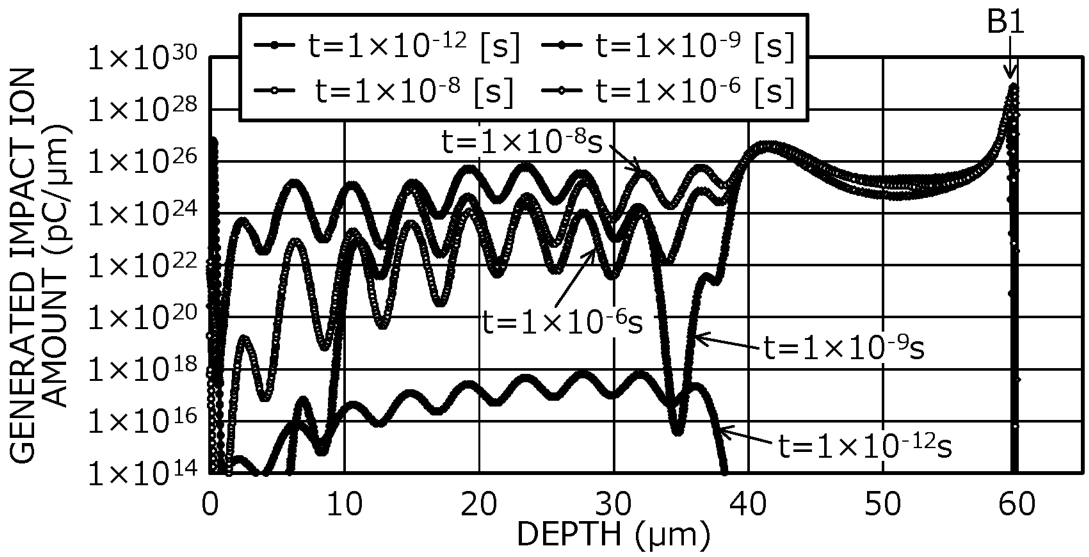
FIG. 12 is a characteristics diagram depicting impact ion generation amount distribution at x=0[μm] in FIGS. 11A to 11D.
Figure 13A:
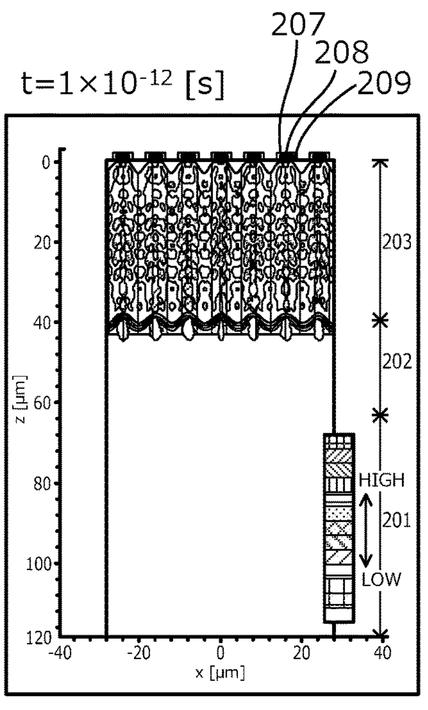
FIG. 13A is a cross-sectional view schematically depicting a state of impact ions in a semiconductor substrate of a second conventional example.
Figure 13B:
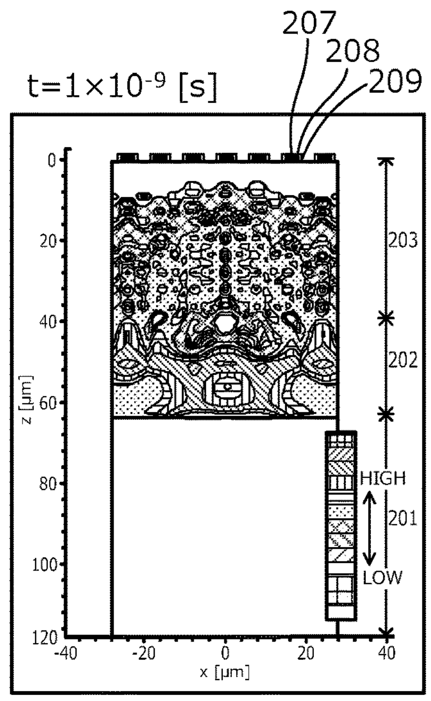
FIG. 13B is a cross-sectional view schematically depicting a state of impact ions in the semiconductor substrate of the second conventional example.
Figure 13C:
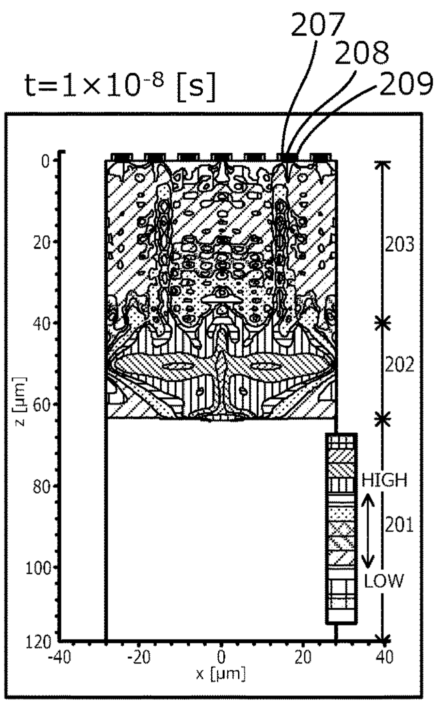
FIG. 13C is a cross-sectional view schematically depicting a state of impact ions in the semiconductor substrate of the second conventional example.
Figure 13D:
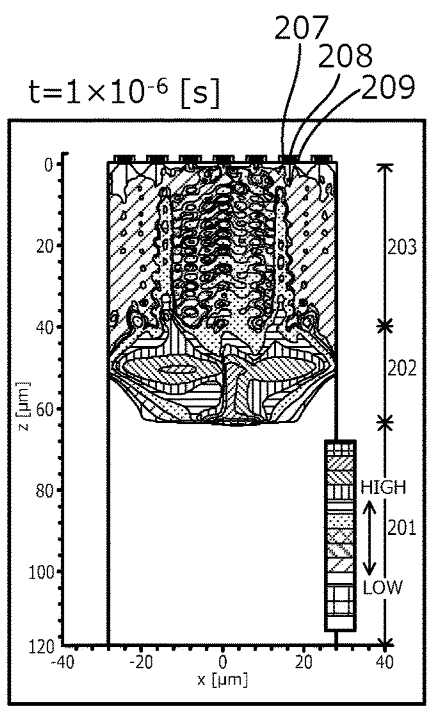
FIG. 13D is a cross-sectional view schematically depicting a state of impact ions in the semiconductor substrate of the second conventional example.
Figure 14:
FIG. 14 is a characteristics diagram depicting impact ion generation amount distribution at x=0[μm] in FIGS. 13A to 13D.
Figure 14:
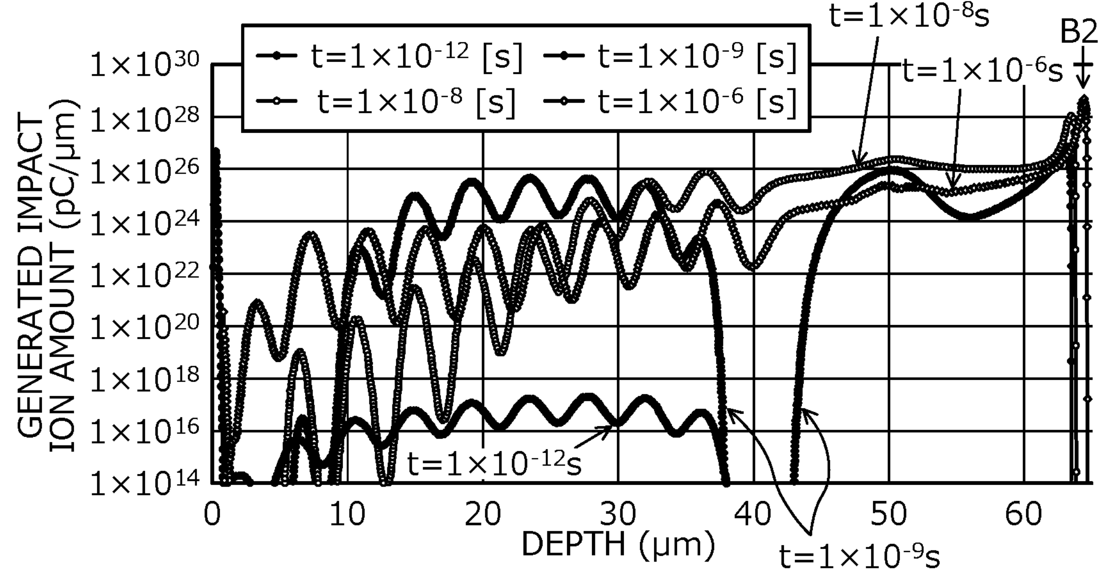

Cosmic ray tolerance of the semiconductor device 10 according to the embodiment was verified. FIGS. 9A, 9B, 9C, 9D, 11A, 11B, 11C, 11D, 13A, 13B, 13C, and 13D are cross-sectional views schematically depicting states of impact ions in the semiconductor substrate of the example, a first conventional example, and the second conventional example. In FIGS. 9A to 9D, 11A to 11D, and 13A to 13D, a horizontal axis is a distance x in the first direction X and a vertical axis is a depth z from the front surface of the semiconductor substrate. In FIGS. 9A to 9D, 11A to 11D, and 13A to 13D, the amount of generated impact ions is greater in the n-type regions 31-1 to 31-10 of the n-type column regions 31 than in the p-type regions 32-1 to 32-10 of the adjacent p-type column regions 32. FIGS. 10, 12, and 14 are characteristics diagrams depicting impact ion generation amount distribution at x=0[μm] in FIGS. 9A to 9D, 11A to 11D, and 13A to 13D. In FIGS. 10, 12, and 14, a horizontal axis is the depth z in FIGS. 9A to 9D and a vertical axis is the impact ion generation amount.

The example is a SJ-MOSFET for which specifications and conditions for a breakdown voltage of a 650V class are set according to the structure of the semiconductor device 10 according to the embodiment. In the first conventional example, only the impurity concentration distribution of the n-type buffer layer 102 differs from that of the example. The second conventional example differs from the example in that the impurity concentration distribution and the total thickness of the n-type buffer layer 202 differ from those in the example. In particular, the first conventional example is a SJ-MOSFET that is set according to the structure of the conventional semiconductor device 110 (refer to FIG. 23) and has the n-type buffer layer 102 that is formed by one stage of epitaxial growth and has a uniform impurity concentration of $2.0\times10^{16}/cm^3$. The total thickness of the n-type buffer layer 102 of the first conventional example is 20 μm.

The second conventional example is a SJ-MOSFET that has the n-type buffer layer 202, which has a two-layer structure formed by two stages of epitaxial growth of different impurity concentrations. The n-type buffer layer 202 of the second conventional example has the same configuration as the n-type buffer layer of International Publication No. WO 2015/040938. In other words, in the n-type buffer layer 202 of the second conventional example, the thickness and the impurity concentration of the n-type buffer layer facing the parallel pn layer 203 is 9 μm and $1.0\times10^{15}/cm^3$, respectively, while the thickness and the impurity concentration of the n-type buffer layer facing the $n^{++}$-type drain layer 201 is 15 μm and $1.0\times10^{16}/cm^3$, respectively. The total thickness of the n-type buffer layer 202 of the second conventional example is 24 μm.

With respect to the example, the first conventional example, and the second conventional example, states of impact ions in the semiconductor substrate were simulated, that is, states when, during reverse recovery operation, heavy ions of a mass equivalent to that of nickel (Ni) ions pass through a center (x=0[μm] in FIGS. 9A to 9D, 11A to 11D, and 13A to 13D) in the first direction X (transverse direction) of the n-type column regions of the parallel pn layer 3, 103, 203. States of the impact ions in the semiconductor substrate of the example, the first conventional example, and the second conventional example are shown in FIGS. 9A to 9D, 11A to 11D, and 13A to 13D.

Here, to evaluate cosmic ray tolerance, nickel ions are used with an assumption that heavy ions of a relatively large mass a generated in outer space. While nickel ions have a higher incidence at higher altitudes, nickel ions are not normally generated at ground level (living space of humans). Having cosmic ray tolerance with respect to nickel ion irradiation means having sufficient cosmic ray tolerance with respect to neutrons that have a high possibility of being irradiated in applications at ground level or slightly higher altitudes.

FIGS. 9A to 9D, 11A to 11D, and 13A to 13D depict results of simulating states of impact ions in the semiconductor substrate during elapsed times of $1.0\times10^{-12}$ [(s: seconds)], $1.0\times10^{-9}$ [s], $1.0\times10^{-8}$ [s], and $1.0\times10^{-6}$ [s] from the heavy ion irradiation. As depicted in FIGS. 9A to 9D, 11A to 11D, and 13A to 13D, impact ions are not generated in the $n^{++}$-type drain layers 1, 101, 201 (impact ion generation amount: low). FIGS. 10, 12, and 14 depict, for each elapsed time, impact ion generation amount distribution at x=0[μm] (i.e., location where heavy ions passed) in FIGS. 9A to 9D, 11A to 11D, and 13A to 13D.

From the results depicted in FIGS. 9A to 9D and 10, it was confirmed that in the example, in a short elapsed time after the heavy ion irradiation (refer to FIG. 9A), the impact ion generation amount is low, the impact ion generation amount increases with the elapse of time (refer to FIGS. 9B to 9D), and the impact ions spread substantially uniformly throughout the $n^{+}$-type buffer layer 2 (as depicted in FIG. 10, the impact ion generation amount distribution in the $n^{+}$-type buffer layer 2 is flat) and as a result, increase of the impact ions at the interface B0 (z=60 μm) between the $n^{+}$-type buffer layer 2 and the $n^{++}$-type drain layer 1 may be suppressed. In other words, in the example, local concentration of electric field at the interface B0 (z=60 μm) between the $n^{+}$-type buffer layer 2 and the $n^{++}$-type drain layer 1 is suppressed, whereby increase of the impact ions at the interface B0 may be suppressed, suggesting that the occurrence of avalanche breakdown is suppressed.

On the other hand, from the results depicted in FIGS. 11A to 11D and 12, it was confirmed that in the first conventional example, in a short elapsed time after the heavy ion irradiation (refer to FIG. 11A), the impact ion generation amount is low, the impact ion generation amount increases with the elapse of time (refer to FIGS. 11B to 11D), and impact ions increased at the interface (z=40 μm) between the parallel pn layer 103 and the n-type buffer layer 102 and at the interface B1 (z=60 μm) between the n-type buffer layer 102 and the $n^{++}$-type drain layer 101. In particular, at the interface B1 between the n-type buffer layer 102 and the $n^{++}$-type drain layer 101, the impact ions increase rapidly, exhibiting a peak value (maximum value), suggesting that at the interface B1, amplification of hole current occurs due to avalanche breakdown.

From the results depicted in FIGS. 13A to 13D and 14, in the second conventional example, it was confirmed that in a short elapsed time after the heavy ion irradiation (refer to FIG. 13A), the impact ion generation amount is low, the impact ion generation amount increases with the elapse of time (refer to FIGS. 13B to 13D), and the impact ions increase at the interface (z=40 μm) between the parallel pn layer 203 and the n-type buffer layer 202, at the interface B2 (z=60 μm) between the n-type buffer layer 202 and the $n^{++}$-type drain layer 201, and at locations (x=0 [μm]) where heavy ions pass in the n-type buffer layer 202. In the second conventional example, it was confirmed that similarly to the first conventional example, at the interface B2 between the n-type buffer layer 202 and the $n^{++}$-type drain layer 201, the impact ions rapidly increase, exhibiting a peak value.

Figure 15:
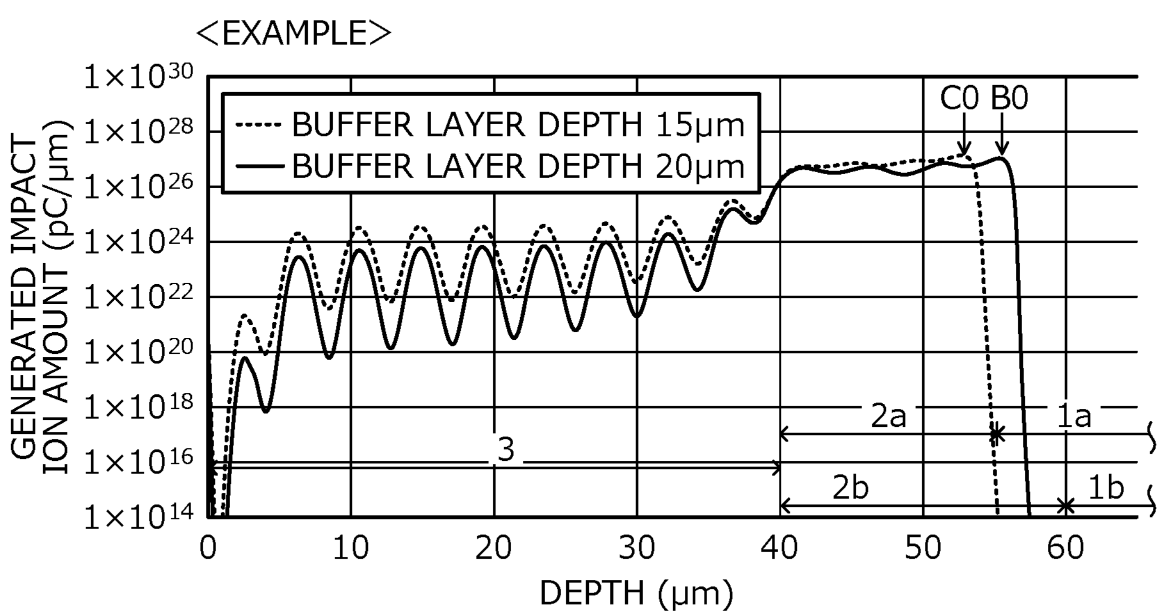
FIG. 15 is a characteristics diagram depicting a relationship between buffer layer thickness and the state of the impact ions in the semiconductor substrate in the example.
Figure 16:
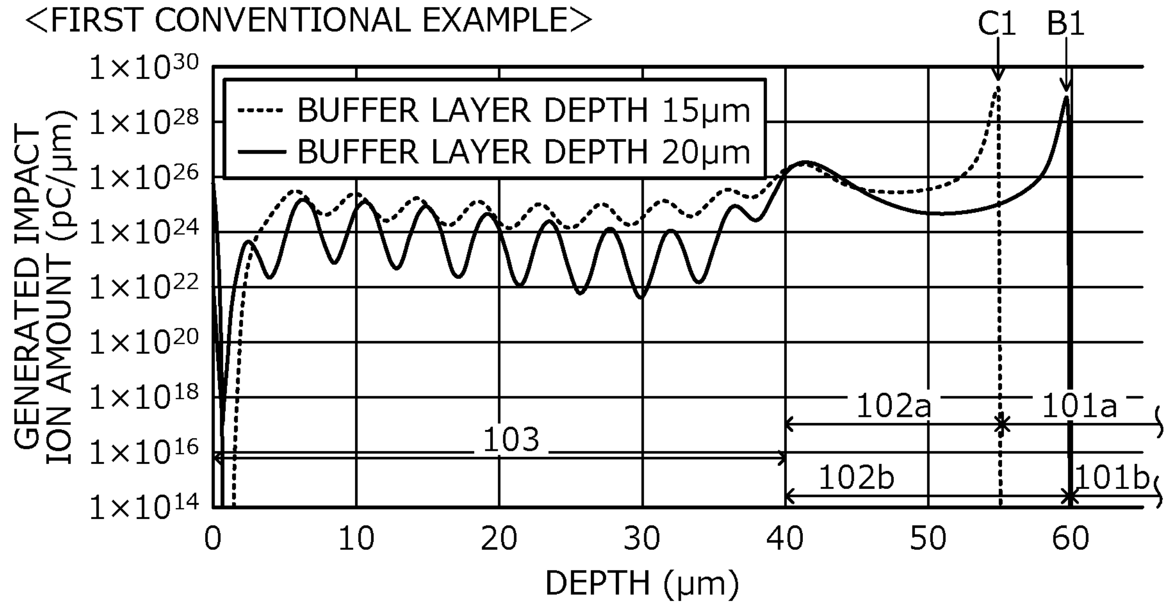
FIG. 16 is a characteristics diagram depicting a relationship between buffer layer thickness and the state of the impact ions in the semiconductor substrate in the first conventional example.
Figure 17A:
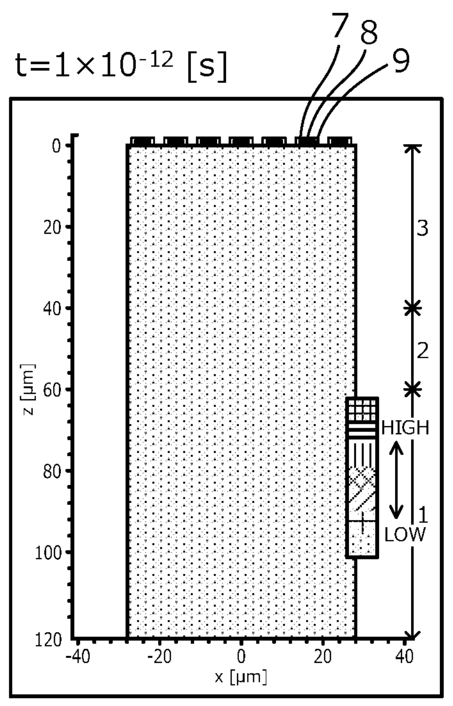
FIG. 17A is a characteristics diagram schematically depicting current density distribution of the example.
Figure 17B:
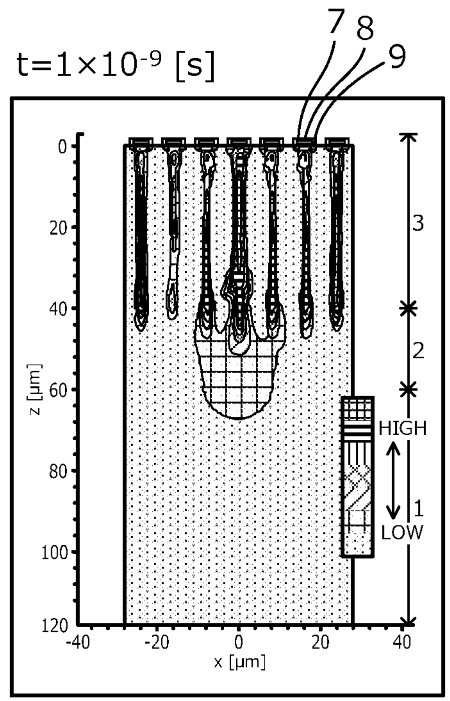
FIG. 17B is a characteristics diagram schematically depicting current density distribution of the example.
Figure 17C:
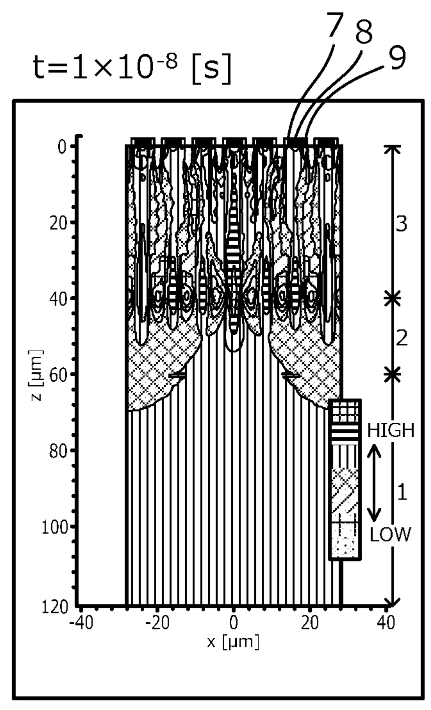
FIG. 17C is a characteristics diagram schematically depicting current density distribution of the example.
Figure 17D:
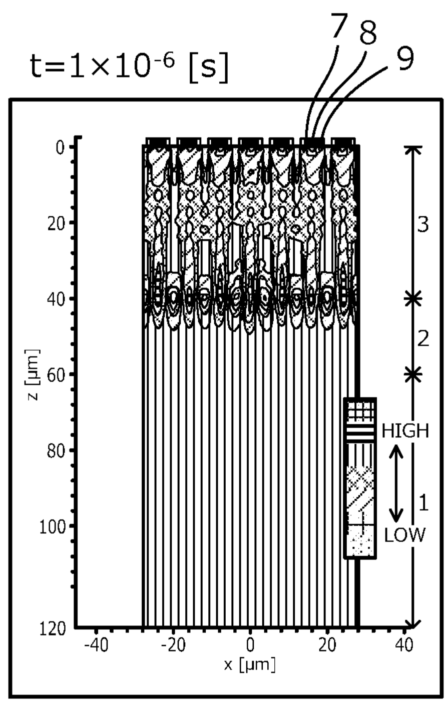
FIG. 17D, is a characteristics diagram schematically depicting current density distribution of the example.
Figure 18A:
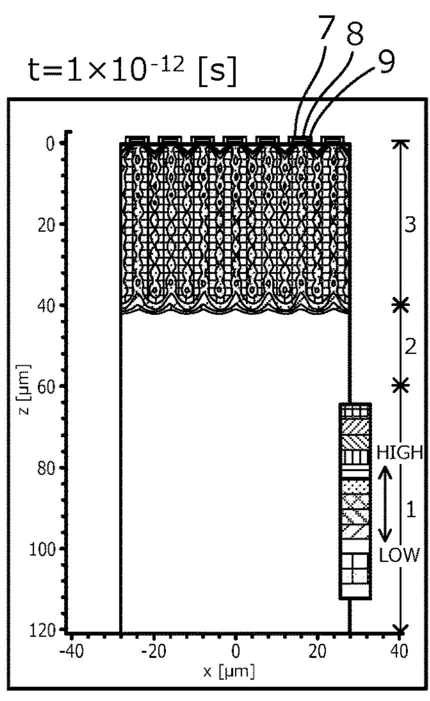
FIG. 18A is a characteristics diagram schematically depicting electric field strength distribution of the example.
Figure 18B:
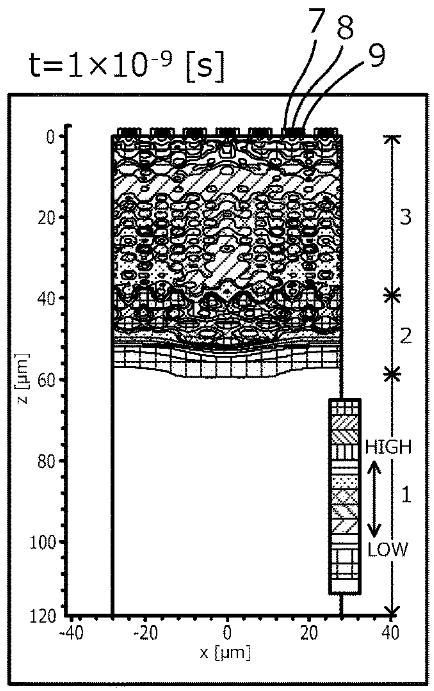
FIG. 18B is a characteristics diagram schematically depicting electric field strength distribution of the example.
Figure 18C:
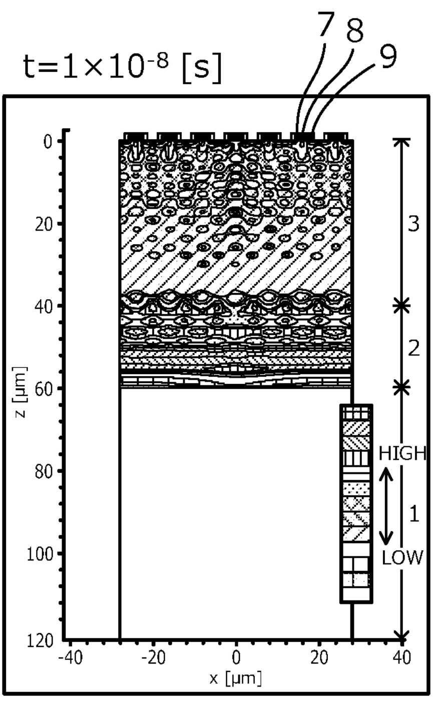
FIG. 18C is a characteristics diagram schematically depicting electric field strength distribution of the example.
Figure 18D:
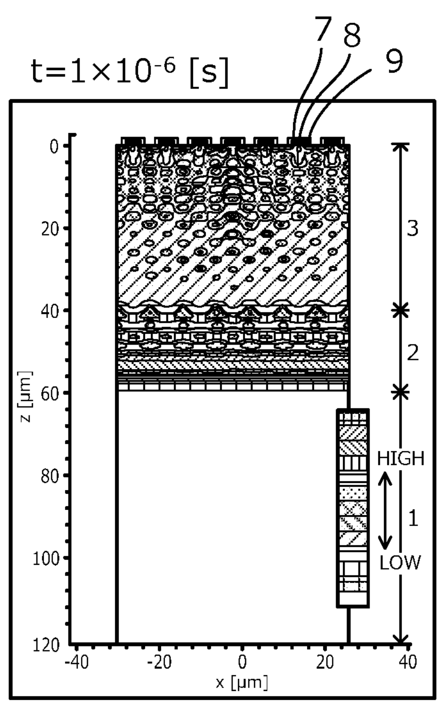
FIG. 18D is a characteristics diagram schematically depicting electric field strength distribution of the example.
Figure 19A:
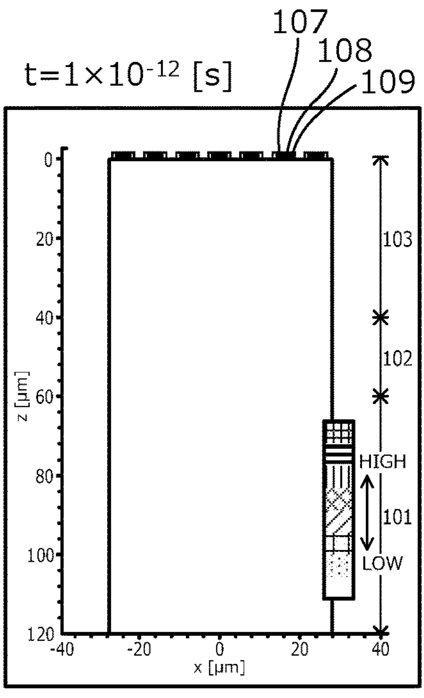
FIG. 19A is a characteristics diagram schematically depicting current density distribution of the first conventional example.
Figure 19B:
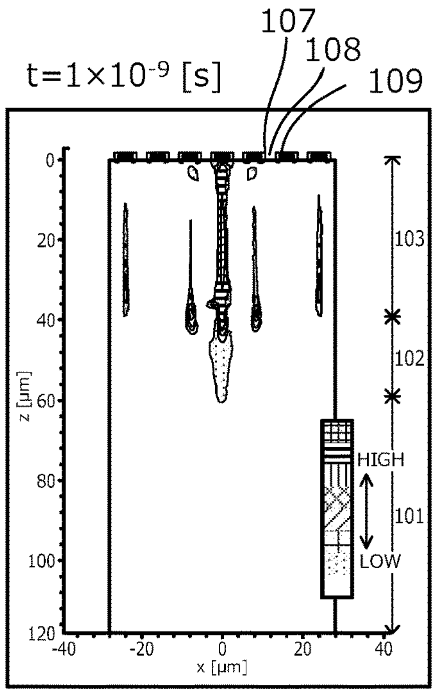
FIG. 19B is a characteristics diagram schematically depicting current density distribution of the first conventional example.
Figure 19C:
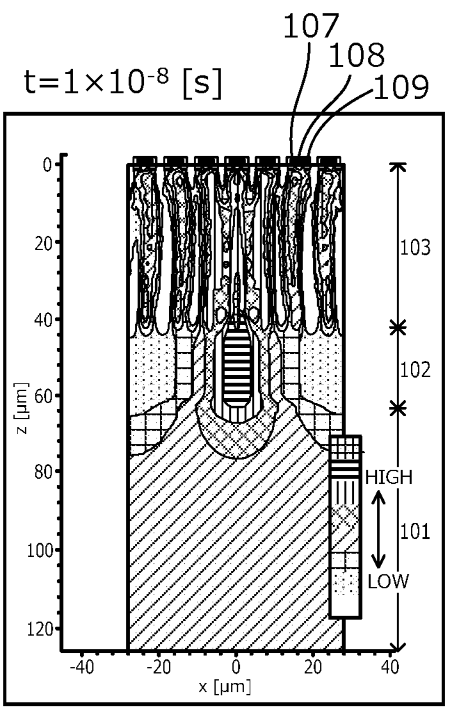
FIG. 19C is a characteristics diagram schematically depicting current density distribution of the first conventional example.
Figure 19D:
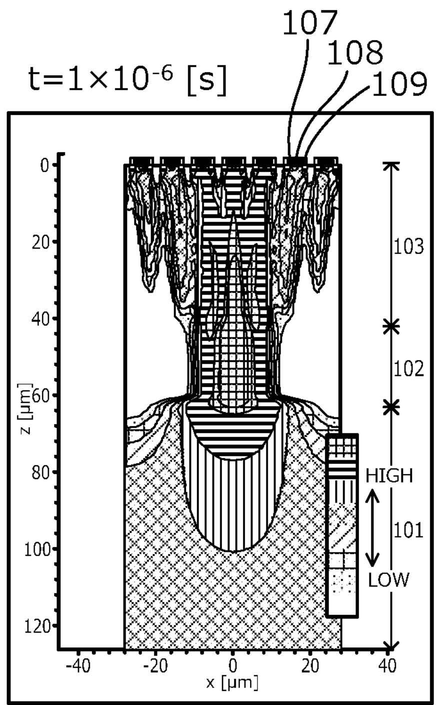
FIG. 19D is a characteristics diagram schematically depicting current density distribution of the first conventional example.
Figure 20A:
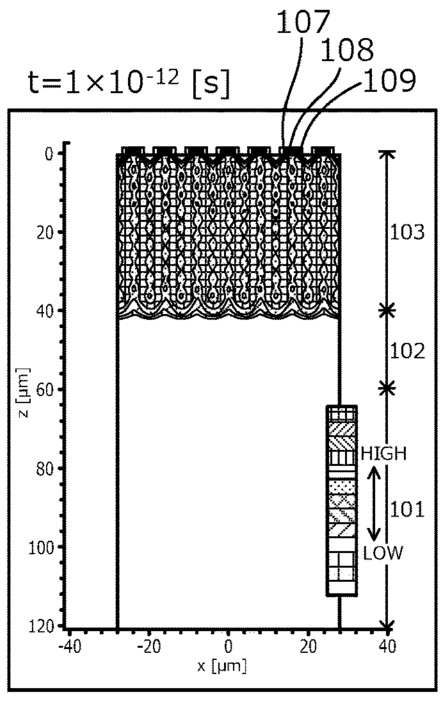
FIG. 20A is a characteristics diagram schematically depicting electric field strength distribution of the second conventional example.
Figure 20B:
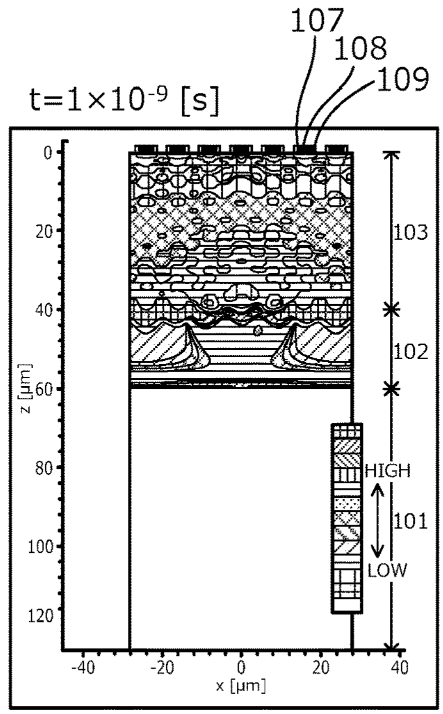
FIG. 20B is a characteristics diagram schematically depicting electric field strength distribution of the second conventional example.
Figure 20C:
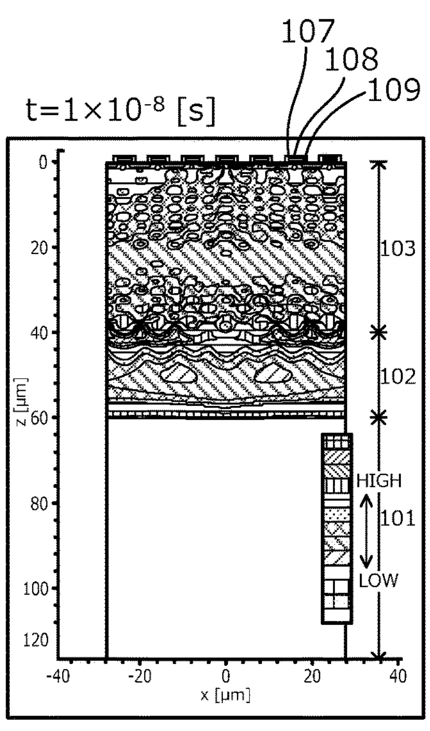
FIG. 20C is a characteristics diagram schematically depicting electric field strength distribution of the second conventional example.
Figure 20D:
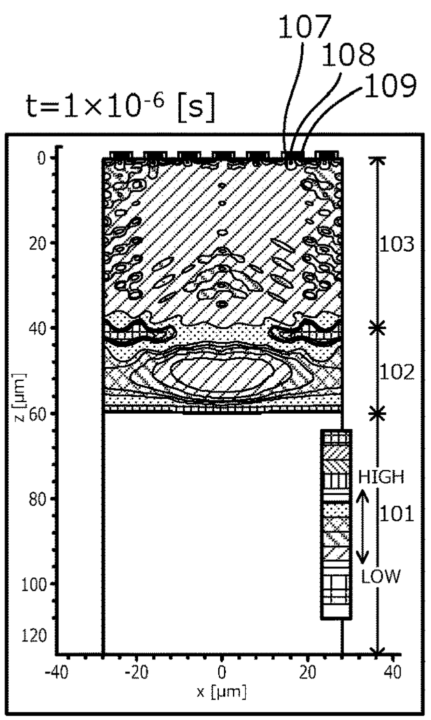
FIG. 20D is a characteristics diagram schematically depicting electric field strength distribution of the second conventional example.

With respect to the example and the first conventional example described above, a relationship between the total thickness t2, t102 of the buffer layer 2, 102 and the state of impact ions in the semiconductor substrate 20, 120 was verified. FIGS. 15 and 16 are characteristics diagrams depicting the relationship between the buffer layer thickness and the state of the impact ions in the semiconductor substrate in the example and the first conventional example. In FIGS. 15 and 16, a horizontal axis is the depth z from the front surface of the semiconductor substrate and a vertical axis is the impact ion generation amount. In FIGS. 15 and 16, impact ion generation amount distributions of samples in which the buffer layer thickness is 20 μm are the same as impact ion generation amount distributions depicted in FIGS. 10 and 12.

In the example, results of simulation of the state of the impact ions in the semiconductor substrate 20 when the total thickness t2 of the $n^{+}$-type buffer layer 2 (2*a*) is 15 μm are depicted in FIG. 15. In the example, for a sample in which the total thickness t2 of the $n^{+}$-type buffer layer 2*a* is 15 μm, as compared to a sample in which the total thickness t2 of the $n^{+}$-type buffer layer 2 (2*b*) is 20 μm, the thickness t1 of the $n^{++}$-type drain layer 1 (1*a*) is increased by the amount that the total thickness t2 of the $n^{+}$-type buffer layer 2*a* is thinner. Two samples of the example depicted in FIG. 15 mutually have the same configuration except that the total thickness t2 of the $n^{+}$-type buffer layers 2*a*, 2*b* and the thickness t1 of the $n^{++}$-type drain layers 1*a*, 1*b* differ.

For comparison, with respect to the first conventional example, results of simulation of the state of the impact ions in the semiconductor substrate 120 when the thickness t102 of the n-type buffer layer 102 (102*a*) is 15 μm are depicted in FIG. 16. Two samples of the first conventional example depicted in FIG. 16 have the same impurity concentration as that of the n-type buffer layers 102*a*, 102*b*, and only the impurity concentration distributions of the n-type buffer layers 102*a*, 102*b* differ from those of the two samples of the example depicted in FIG. 15. The two samples of the first conventional example depicted in FIG. 16 have the same configuration except that the thickness t102 of the n-type buffer layers 102*a*, 102*b* and the thickness t101 of the $n^{++}$-type drain layer 101*a*, 101*b* differ.

From the results depicted in FIGS. 15 and 16, it was confirmed that for the example and the first conventional example, in the samples in which the total thicknesses t2, t102 of the buffer layers 2*a*, 102*a* was 15 μm, the total thicknesses t2, t102 of the buffer layers 2*a*, 102*a* were thin, whereby in the semiconductor substrates 20, 120, current density of current due to impact ions increased and thus, compared to the samples in which the total thicknesses t2, t102 of the buffer layers 2*b*, 102*b* were 20 μm, increase of the impact ions in the parallel pn layers 3, 103 and the increase of the peak value of the increase of the impact ions at the interfaces CO, Cl between the buffer layers 2*a*, 102*a* and the $n^{++}$-type drain layers 1*a*, 101*a* were prominent.

Thus, in the example, it was confirmed that while dependence on the total thickness t2 of the $n^{+}$-type buffer layer 2 related to the state of the impact ions in the semiconductor substrate 20 is the same as that in the first conventional example, the impurity concentration of the $n^{+}$-type buffer layer 2 increases as the proximity to the $n^{++}$-type drain layer 1 increases, whereby even when the total thickness t2 of the $n^{+}$-type buffer layer 2*a* is reduced, increase of the impact ions at the interface CO between the $n^{+}$-type buffer layer 2*a* and the $n^{++}$-type drain layer 1*a* is suppressed. While not depicted, in the second conventional example as well, results similar to those of the first conventional example (FIG. 16) were confirmed by the inventor.

Further, current density and electric field strength of the example, the first conventional example, and the second conventional example described above were verified. FIGS. 17A, 17B, 17C, 17D, 19A, 19B, 19C, 19D, 21A, 21B, 21C, and 21D are characteristics diagrams schematically depicting current density distribution of the example, the first conventional example, and the second conventional example. FIGS. 18A, 18B, 18C, 18D, 20A, 20B, 20C, 20D, 22A, 22B, 22C, and 22D are characteristics diagrams schematically depicting electric field strength distribution of the example, the first conventional example, and the second conventional example. FIGS. 17A to 17D, 19A to 19D, and 21A to 21D depict current density distribution corresponding to the state of the impact ions, viewed from the same cross-sections in FIGS. 9A to 9D, 11A to 11D, and 13A to 13D, respectively. FIGS. 18A to 18D, 20A to 20D, and 22A to 22D are electric field strength distributions corresponding to the state of the impact ions, viewed from the same cross-sections in FIGS. 9A to 9D, 11A to 11D, and 13A to 13D, respectively.

For samples in which the thickness of the buffer layers 2, 102, 202 of the example, the first conventional example, and the second conventional example are 20 μm, current density distributions of current due to the impact ions in the semiconductor substrate are depicted in FIGS. 17A to 17D, 19A to 19D, and 21A to 21D, and electric field strength distributions in the semiconductor substrates are depicted in FIGS. 18A to 18D, 20A to 20D, and 22A to 22D. In FIGS. 17A to 17D, 19A to 19D, and 21A to 21D, lightly shaded areas are relatively large areas of current density of current (flow of holes accelerated in a direction to the $n^{++}$-type drain layers 1, 101, 201 by electric field occurring at the parallel pn layers 3, 103, 203 due to impact ionization) due to impact ions. In FIGS. 18A to 18D, 20A to 20D, and 22A to 22D, electric field is not applied to the $n^{++}$-type drain layers 1, 101, 201 (electric field strength: low).

From the results depicted in FIGS. 17A to 17D, it was confirmed that in the example, current is not generated by impact ions in a short elapsed time after the heavy ion irradiation (refer to FIG. 17A), and current is generated by impact ions in all the n-type column regions of the parallel pn layer 3 with the elapse of time (refer to FIGS. 17B to 17D) and spread uniformly throughout the $n^+$-type buffer layer 2 and throughout the $n^{++}$-type drain layer 1, from the n-type column regions of the parallel pn layer 3.

Further, from the results depicted in FIGS. 18A to 18D, it was confirmed that in the example, in a short elapsed time after the heavy ion irradiation (refer to FIG. 1A), electric field is borne by the entire parallel pn layer 3, the electric field from the parallel pn layer 3 is distributed throughout the $n^+$-type buffer layer 2 with the elapse of time (refer to FIGS. 18B to 18D), and the occurrence of avalanche breakdown may be suppressed (amplification of hole current due to avalanche breakdown does not occur).

On the other hand, from the results depicted in FIGS. 19A to 19D, it was confirmed that in the first conventional example, in a short elapsed time after the heavy ion irradiation (refer to FIG. 19A), current is not generated by impact ions, current is generated in all of the n-type column regions of the parallel pn layer 103 by impact ions with the elapse of time (refer to FIG. 19B to 19D); however, in the parallel pn layer 103 and in the $n^+$-type buffer layer 102, current density locally increases at locations where heavy ions pass (x=0[μm]) and in vicinities thereof.

Further, from the results depicted in FIGS. 20A to 20D, it was confirmed that in the first conventional example, in a short elapsed time after the heavy ion irradiation (refer to FIG. 20A), electric field is borne by the entire parallel pn layer 103, electric field applied to the parallel pn layer 103 decreases with the elapse of time (refer to FIG. 20B to 20D), electric field concentrates at the interface (z=60 μm) between the n-type buffer layer 102 and the $n^{++}$-type drain layer 101, avalanche breakdown occurs due to the concentration of the electric field, and hole current is locally amplified, leading to destruction.

Figure 21A:
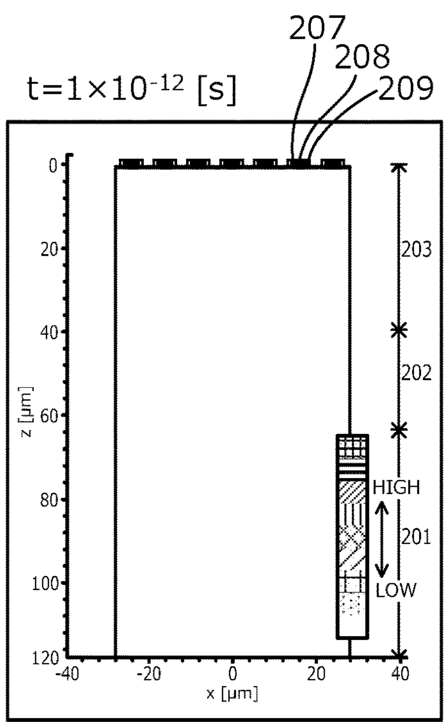
FIG. 21A is a characteristics diagram schematically depicting current density distribution of the second conventional example.
Figure 21B:
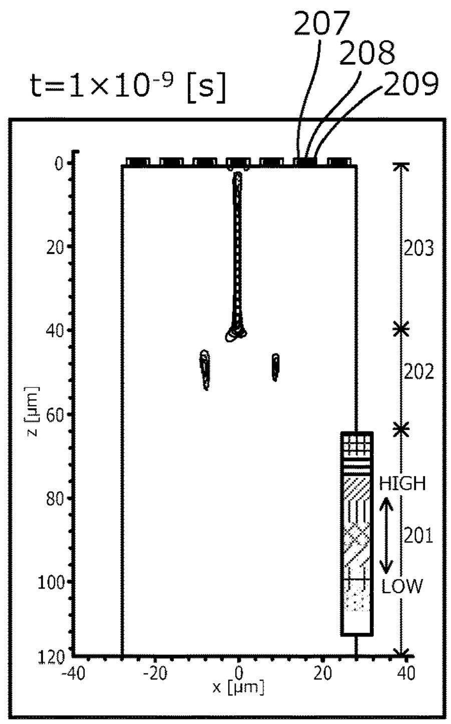
FIG. 21B is a characteristics diagram schematically depicting current density distribution of the second conventional example.
Figure 21C:
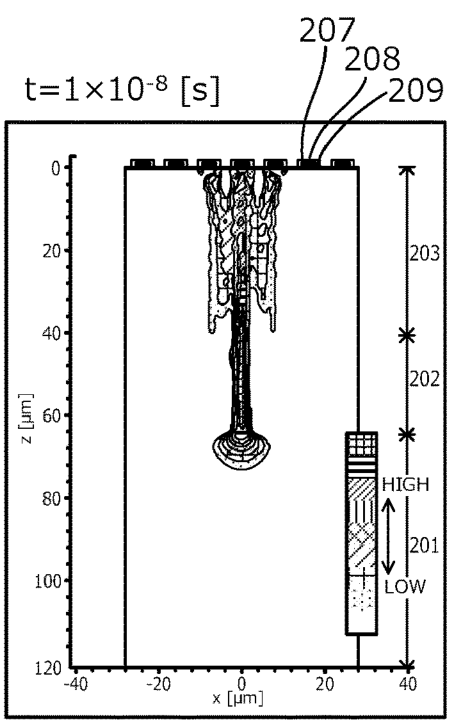
FIG. 21C is a characteristics diagram schematically depicting current density distribution of the second conventional example.
Figure 21D:
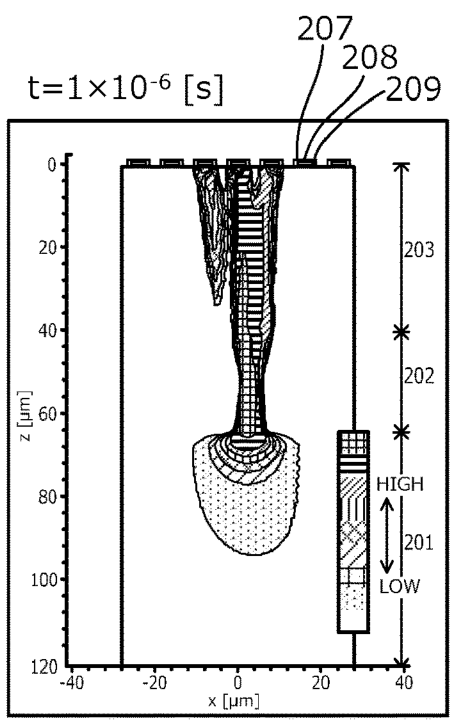
FIG. 21D is a characteristics diagram schematically depicting current density distribution of the second conventional example.
Figure 22A:
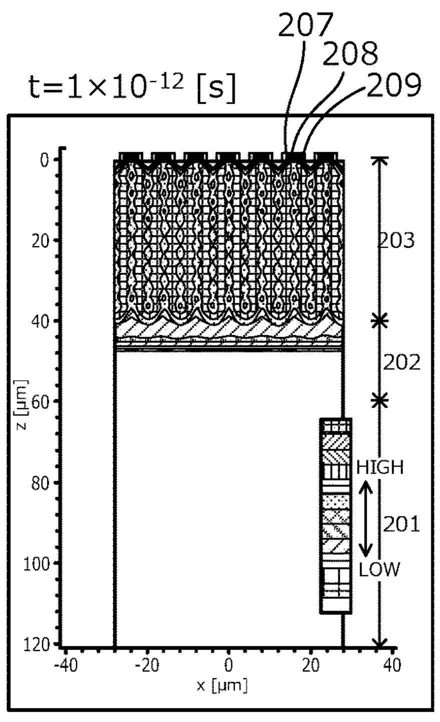
FIG. 22A is a characteristics diagram schematically depicting electric field strength distribution of the second conventional example.
Figure 22B:
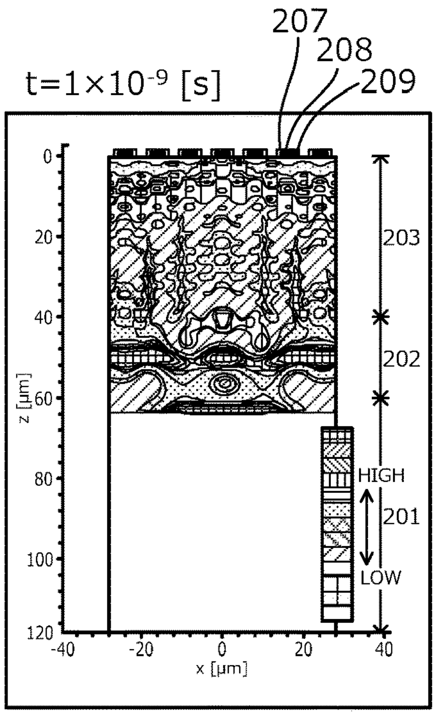
FIG. 22B is a characteristics diagram schematically depicting electric field strength distribution of the second conventional example.
Figure 22C:
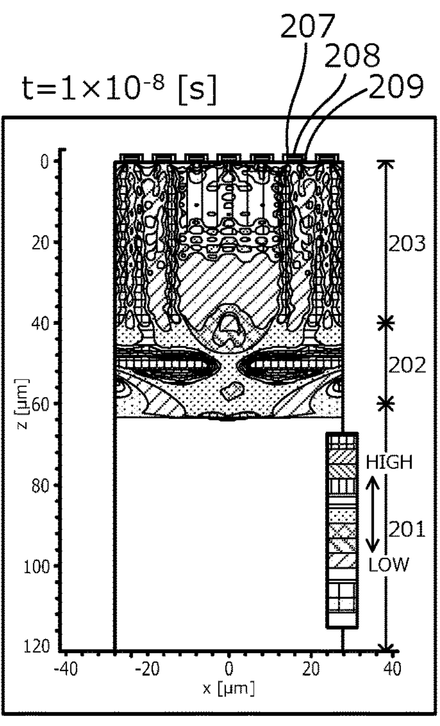
FIG. 22C is a characteristics diagram schematically depicting electric field strength distribution of the second conventional example.
Figure 22D:
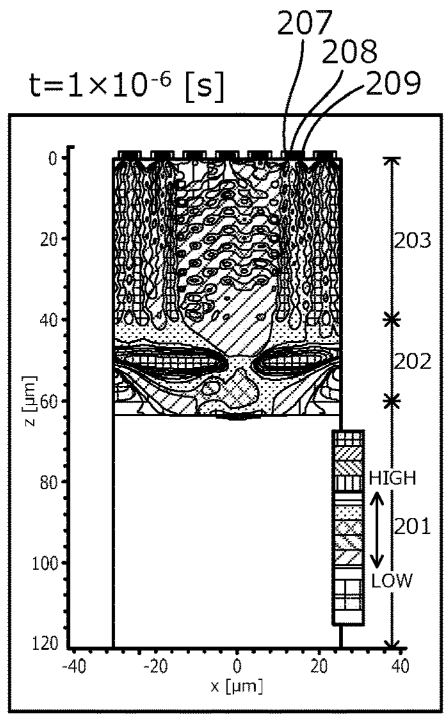
FIG. 22D is a characteristics diagram schematically depicting electric field strength distribution of the second conventional example.

From the results depicted in FIGS. 21A to 21D, it was confirmed that in the second conventional example, of the two stages of the n-type buffer layers configuring the n-type buffer layer 202, the impurity concentration of the n-type buffer layer facing the parallel pn layer 203 is relatively lower, whereby along the paths (n-type column regions of the parallel pn layer 203: x=0[μm]) that the heavy ions pass, current due to the impact ions flows all at once from the front surface of the semiconductor substrate to the interface (z=60 μm) between the n-type buffer layer 202 and the $n^{++}$-type drain layer 201 (refer to FIGS. 21B to 21D). It was confirmed that independent of the elapse of time after the heavy ion irradiation, current due to the impact ions does not flow to locations other than the paths that heavy ions pass.

Further, from the results depicted in FIGS. 22A to 22D, it was confirmed that in the second conventional example, in a short elapsed time after the heavy ion irradiation (refer to FIG. 22A), electric field is borne by the entire parallel pn layer 3, electric field applied to the parallel pn layer 203 decreases with the elapse of time (refer to FIGS. 22B to 22D), electric field concentrates at portions of the parallel pn layer 203 apart from the paths that the heavy ions pass, concentrates inside (interface between the two stages of the n-type buffer layers having different impurity concentrations) the n-type buffer layer 202, and concentrates at the interface (z=60 μm) between the n-type buffer layer 202 and the $n^{++}$-type drain layer 201, avalanche breakdown occurs due to the concentration of electric field at the n-type buffer layer 202, and hole current is locally amplified, leading to destruction.

In the example described above, while an instance in which during reverse recovery operation, heavy ions pass through the center (x=0[μm]) in the first direction X of the n-type column regions 31 of the parallel pn layer 3 was verified as an example, in other instances in which other locations of the parallel pn layer 3 are passed, substantially the same results are obtained.

In the foregoing, the present invention is not limited to the described embodiments and various modifications within a range not departing from the spirit of the invention are possible. For example, in the described embodiments, dimensions, impurity concentration, etc. of parts are variously set according to necessary specifications. Further, instead of the planar gate structure, a trench gate structure is possible. Further, the present invention is similarly implemented when the conductivity types (n-type, p-type) are reversed.

According to the invention described above, even when a depletion layer spreads rapidly in the semiconductor substrate in a direction to the first semiconductor layer due to cosmic ray irradiation during reverse recovery operation, the spreading of the depletion layer is suppressed step-wise corresponding to the impurity concentration gradient of the second semiconductor layer and may be suppressed in the entire second semiconductor layer. As a result, rapid suppression of the depletion layer may be prevented, whereby local concentration of electric field may be suppressed.

The semiconductor device according to the present invention achieves an effect in that cosmic ray tolerance may be enhanced.

As described, the semiconductor device according to the present invention is useful for semiconductor devices for which a predetermined cosmic ray tolerance is necessary from the perspective of reliability in applications in outer space and in terrestrial applications; the semiconductor device according to the present invention is particularly suitable for MOSFETs used as automotive components and MOSFETs used at high-altitude observatories.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:

a semiconductor substrate having a first main surface and a second main surface that are opposite to each other;

a parallel pn layer in which a plurality of first-conductivity-type regions and a plurality of second-conductivity-type regions are disposed so as to be adjacent to one another and repeatedly alternate with one another, the parallel pn layer being provided in the semiconductor substrate;

a device structure provided between the first main surface of the semiconductor substrate and the parallel pn layer;

a first semiconductor layer of a first conductivity type, the first semiconductor layer being provided between the second main surface of the semiconductor substrate and the parallel pn layer and having an impurity concentration that is higher than an impurity concentration of the plurality of first-conductivity-type regions;

a second semiconductor layer of the first conductivity type, the second semiconductor layer being provided between the first semiconductor layer and the parallel pn layer and having an impurity concentration that is lower than the impurity concentration of the first semiconductor layer;

a first electrode provided on the first main surface, the first electrode being electrically connected to the device structure; and a second electrode provided on the second main surface, the second electrode being electrically connected to the first semiconductor layer, wherein in a thickness direction of the second semiconductor layer from the parallel pn layer to the first semiconductor layer, the impurity concentration of the second semiconductor layer monotonically increases from a starting value equal to the impurity concentration of the plurality of first-conductivity-type regions to an ending value equal to the impurity concentration of the first semiconductor layer.

2. The semiconductor device according to claim 1, wherein the second semiconductor layer is constituted by a plurality of first-conductivity-type layers disposed in descending order of impurity concentration from the first semiconductor layer, and the impurity concentration of each of the plurality of first-conductivity-type layers increases closer to the first semiconductor layer by a predetermined gradient.

3. The semiconductor device according to claim 1, wherein a difference of impurity concentrations between an adjacent two of the plurality of first-conductivity-type layers in a depth direction is threefold or less.

4. The semiconductor device according to claim 1, wherein the impurity concentration of the second semiconductor layer is at least 1/200 times the impurity concentration of the first semiconductor layer at an interface between the second semiconductor layer and the first semiconductor layer.

5. The semiconductor device according to claim 1, wherein the second semiconductor layer is constituted by at least four first-conductivity-type layers that are stacked upon one another.

6. The semiconductor device according to claim 1, wherein in the thickness direction, the impurity concentration of the second semiconductor layer monotonically increases with one predetermined gradient.

* * * * *